US010741682B2

(12) United States Patent
Jeon et al.

(10) Patent No.: US 10,741,682 B2
(45) Date of Patent: Aug. 11, 2020

(54) HIGH-ELECTRON-MOBILITY TRANSISTOR (HEMT) SEMICONDUCTOR DEVICES WITH REDUCED DYNAMIC RESISTANCE

(71) Applicant: SEMICONDUCTOR COMPONENTS INDUSTRIES, LLC, Phoenix, AZ (US)

(72) Inventors: Woochul Jeon, Phoenix, AZ (US); Ali Salih, Mesa, AZ (US); Llewellyn Vaughan-Edmunds, Campbell, CA (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 0 days.

(21) Appl. No.: 15/807,237

(22) Filed: Nov. 8, 2017

(65) Prior Publication Data
US 2018/0138306 A1 May 17, 2018

Related U.S. Application Data

(60) Provisional application No. 62/423,547, filed on Nov. 17, 2016.

(51) Int. Cl.
H01L 29/778 (2006.01)
H01L 29/417 (2006.01)
H01L 29/08 (2006.01)
H01L 29/872 (2006.01)
H01L 29/66 (2006.01)
(Continued)

(52) U.S. Cl.
CPC ...... H01L 29/7787 (2013.01); H01L 29/0843 (2013.01); H01L 29/41758 (2013.01); H01L 29/41766 (2013.01); H01L 29/66462 (2013.01); H01L 29/7783 (2013.01); H01L 29/872 (2013.01); H01L 29/0619 (2013.01); H01L 29/1066 (2013.01); H01L 29/2003 (2013.01); H01L 29/205 (2013.01); H01L 29/402 (2013.01)

(58) Field of Classification Search
CPC ............ H01L 29/0843; H01L 29/7787; H01L 29/41766; H01L 29/41758; H01L 29/7783; H01L 29/872; H01L 29/66462
See application file for complete search history.

(56) References Cited

U.S. PATENT DOCUMENTS 4,727,403 A * 2/1988 Hida ................. H01L 29/10
257/194
7,939,391 B2 * 5/2011 Suh ................. H01L 29/2003
257/194

(Continued)

OTHER PUBLICATIONS

Lian et. al., "Drain E-field Manipulation in AlGaN/GaN HEMTs by Schottky Extension Technology", IEEE Transactions on Electron Devices, vol. 62, No. 2, Feb. 2015.*

(Continued)

Primary Examiner — Allen L Parker
Assistant Examiner — Charles N Ausar-El
(74) Attorney, Agent, or Firm — Brake Hughes Bellermann LLP

(57) ABSTRACT

High-electron-mobility transistor (HEMT) devices are described in this patent application. In some implementations, the HEMT devices can include a back barrier hole injection structure. In some implementations, the HEMT devices include a conductive striped portion electrically coupled to a drain contact.

16 Claims, 16 Drawing Sheets

(51) Int. Cl.
*H01L 29/205* (2006.01)
*H01L 29/20* (2006.01)
*H01L 29/06* (2006.01)
*H01L 29/40* (2006.01)
*H01L 29/10* (2006.01)

(56) References Cited

U.S. PATENT DOCUMENTS

| | | | | |
|---|---|---|---|---|
| 8,436,398 | B2* | 5/2013 | Lidow | H01L 29/1066 |
| | | | | 257/189 |
| 8,785,944 | B2* | 7/2014 | Hwang | H01L 27/0629 |
| | | | | 257/195 |
| 8,928,037 | B2* | 1/2015 | Ramdani | H01L 21/02178 |
| | | | | 257/192 |
| 8,937,338 | B2* | 1/2015 | Chowdhury | H01L 29/66204 |
| | | | | 257/194 |
| 9,136,347 | B2* | 9/2015 | Park | H01L 29/737 |
| 9,577,048 | B1* | 2/2017 | Yang | H01L 29/66462 |
| 9,621,153 | B2* | 4/2017 | Ikeda | H01L 29/7787 |
| 9,640,632 | B2* | 5/2017 | Ritenour | H01L 23/34 |
| 10,204,998 | B2* | 2/2019 | Yang | H01L 29/66462 |
| 10,249,725 | B2* | 4/2019 | Lin | H01L 29/2003 |
| 10,270,436 | B2* | 4/2019 | Chen | H03K 17/063 |
| 2007/0132037 | A1* | 6/2007 | Hoshi | H01L 21/28587 |
| | | | | 257/396 |
| 2010/0025730 | A1* | 2/2010 | Heikman | H01L 29/7787 |
| | | | | 257/194 |
| 2011/0260217 | A1 | 10/2011 | Okamoto et al. | |
| 2014/0138704 | A1* | 5/2014 | Tanaka | H01L 29/41725 |
| | | | | 257/76 |
| 2014/0203289 | A1* | 7/2014 | Liu | H01L 29/432 |
| | | | | 257/76 |
| 2014/0252368 | A1* | 9/2014 | Lee | H01L 29/66462 |
| | | | | 257/76 |
| 2014/0264379 | A1* | 9/2014 | Kub | H01L 29/41725 |
| | | | | 257/77 |
| 2016/0315179 | A1* | 10/2016 | Nishimori | H01L 29/207 |
| 2016/0380093 | A1* | 12/2016 | Huang | H01L 29/66462 |
| | | | | 257/77 |
| 2017/0062581 | A1* | 3/2017 | You | H01L 29/66462 |
| 2017/0194474 | A1* | 7/2017 | Shirota | H01L 29/4236 |
| 2017/0263700 | A1* | 9/2017 | Stoffels | H01L 29/7786 |
| 2017/0338810 | A1* | 11/2017 | Chen | H01L 29/7786 |
| 2018/0108767 | A1* | 4/2018 | Iucolano | H01L 21/0254 |
| 2019/0043978 | A1* | 2/2019 | Makabe | H01L 29/7787 |

OTHER PUBLICATIONS

Uemoto et. al., "Gate Injection Transistor (GIT)—A Normally-Off AlGaN/GaN Power Transistor Using Conductivity Modulation", IEEE Transactions on Electron Devices, vol. 54, No. 12, December 2007. (Year: 2007).*

Uemoto et. al., "A Normally-off AlGaN/GaN Transistor with RonA= 2.6mΩcm2 and BVds=640V Using Conductivity Modulation" International Electron Devices Meeting 2006 (Year: 2006).*

Saichiro Kaneko et al. "Current-collapse-free Operations up to 850 V by GaN-GIT Utilizing Hole Injection from Drain," May 10-14, 2015, pp. 41-44.

* cited by examiner

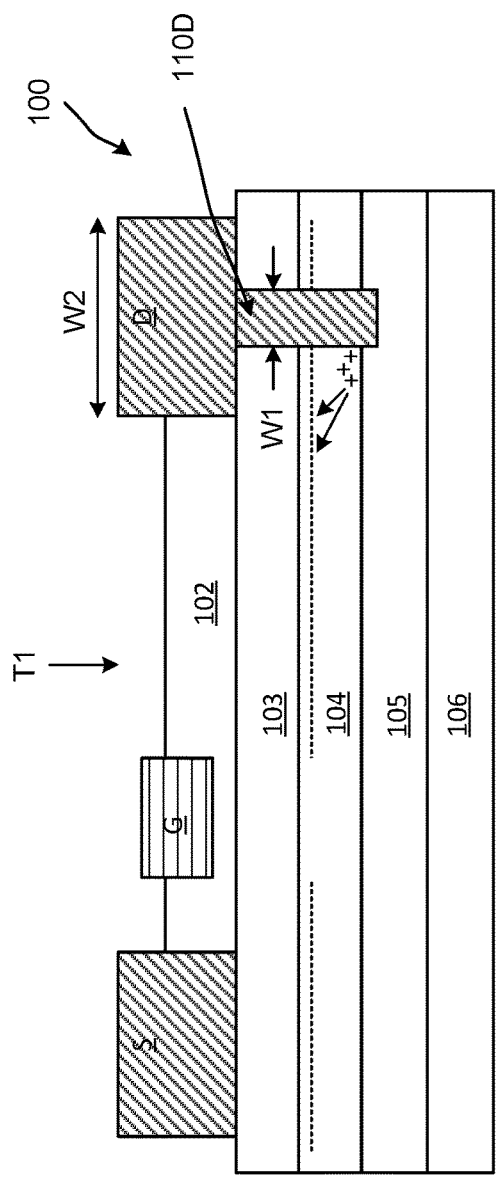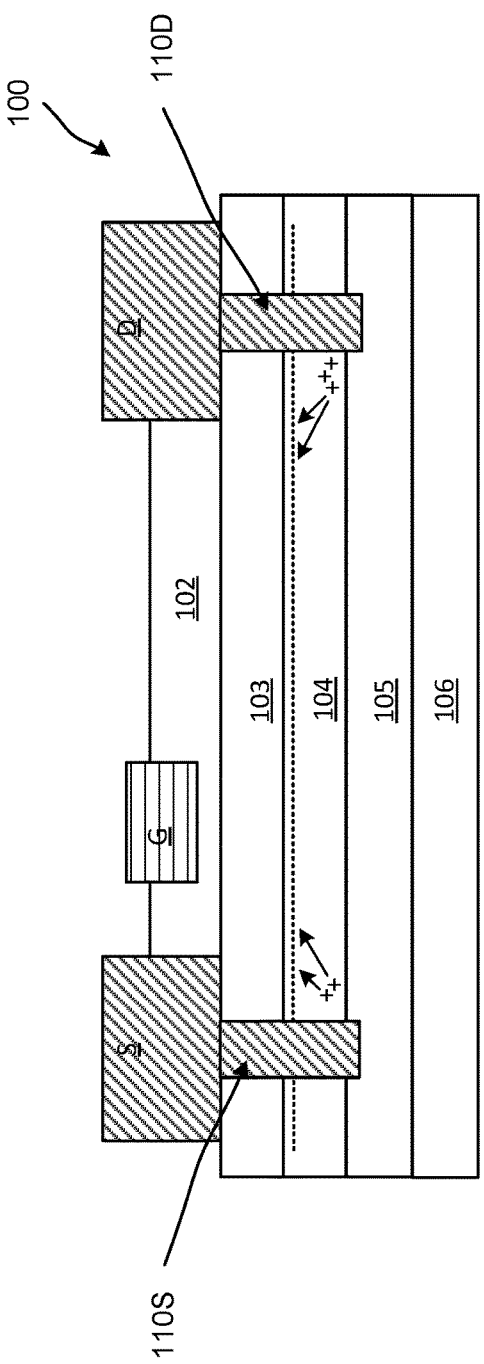

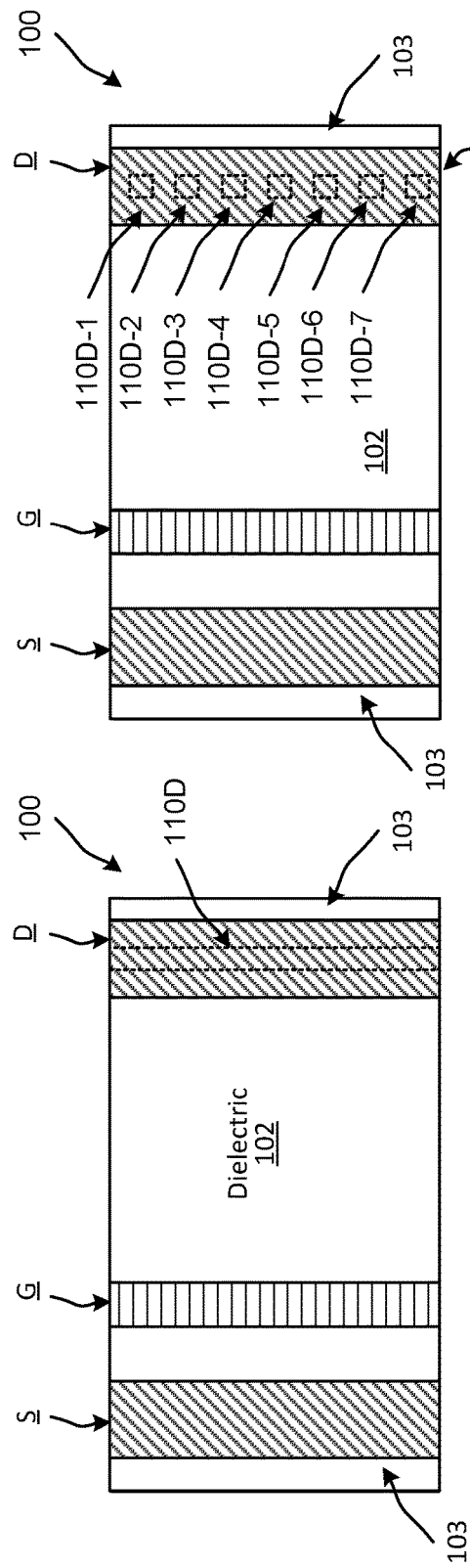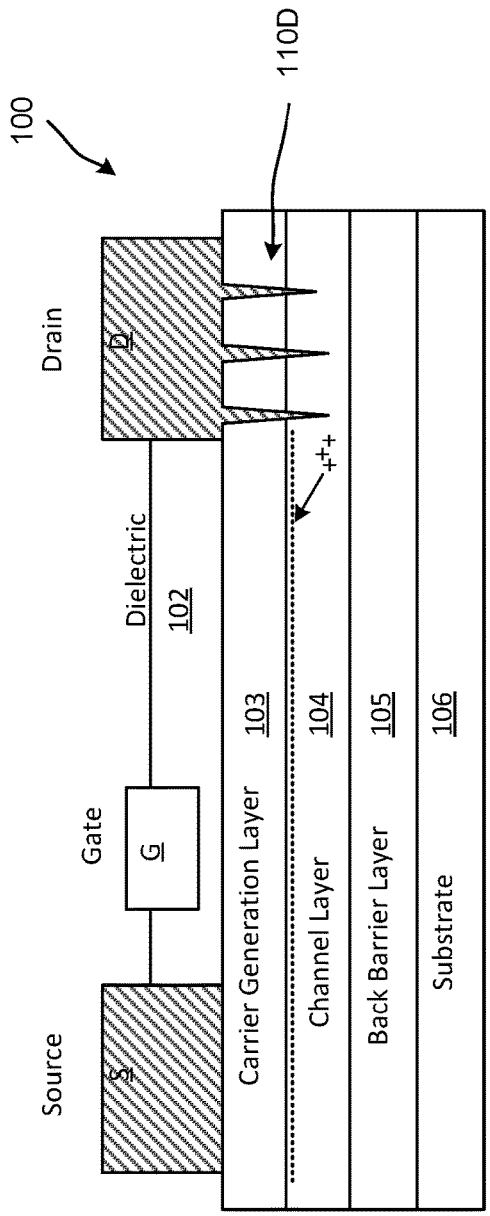

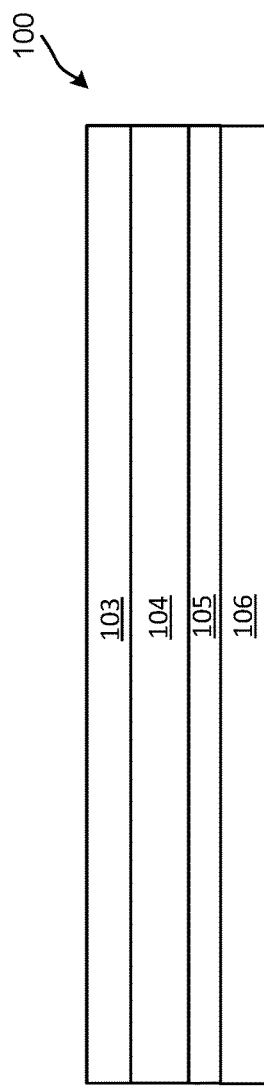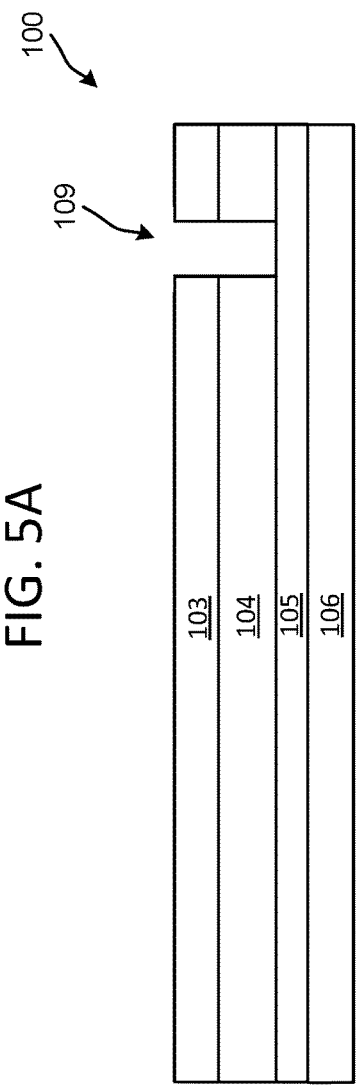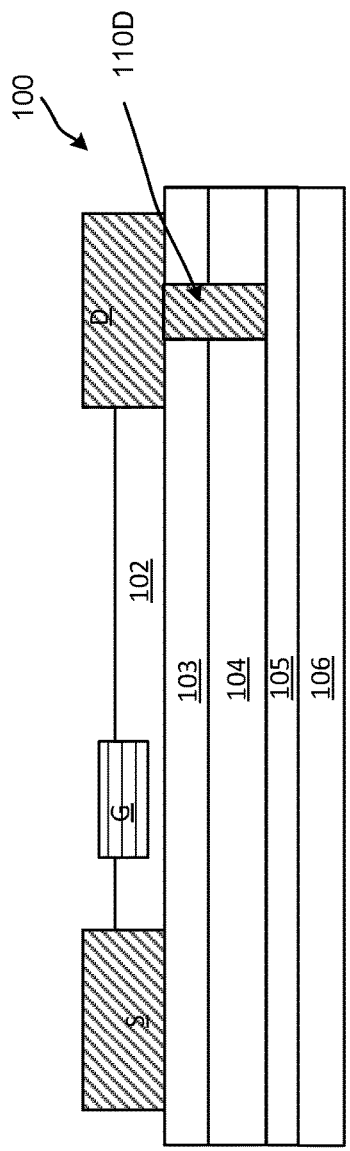

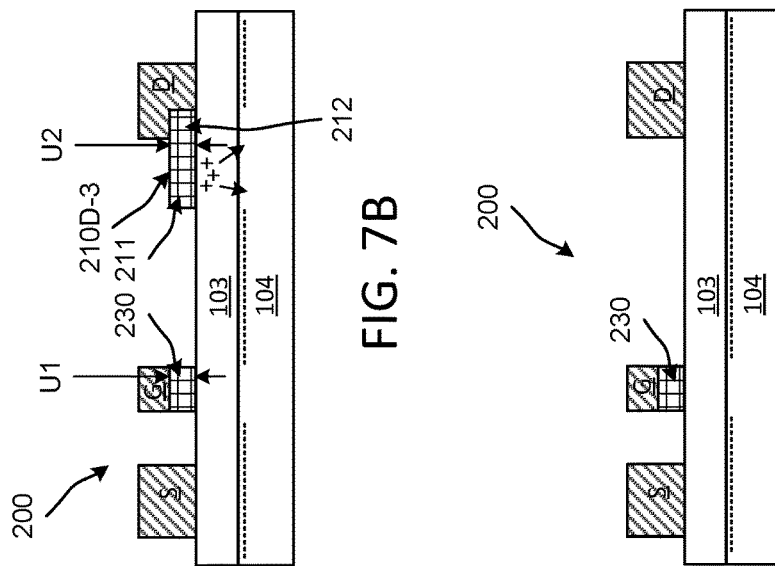
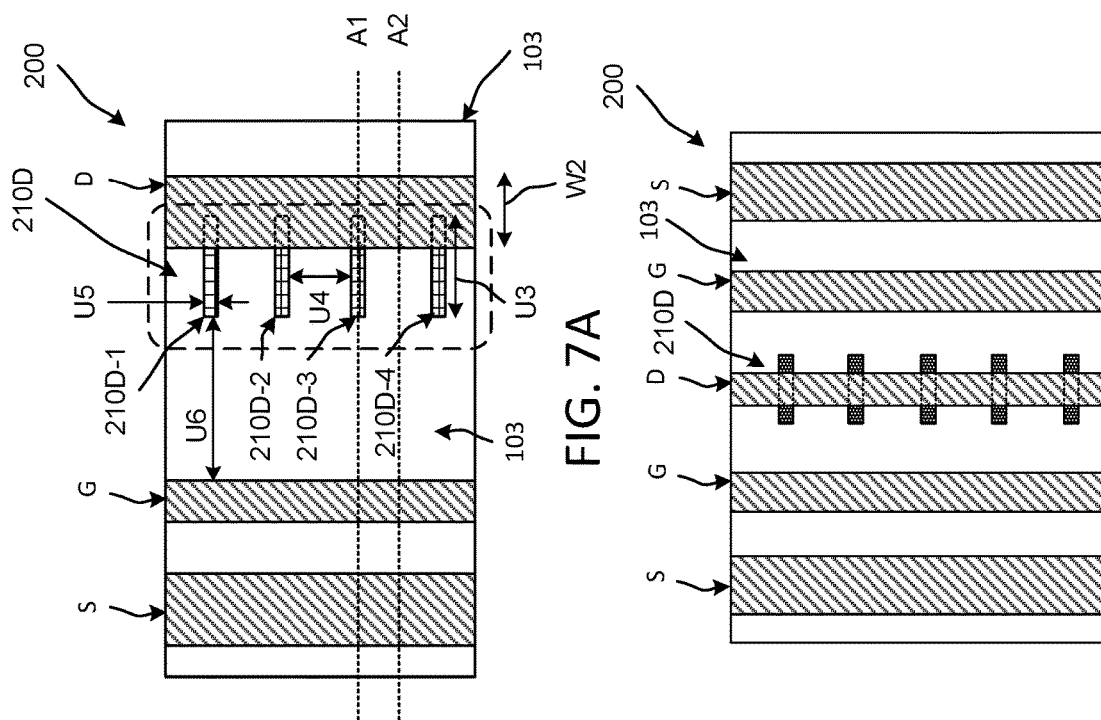

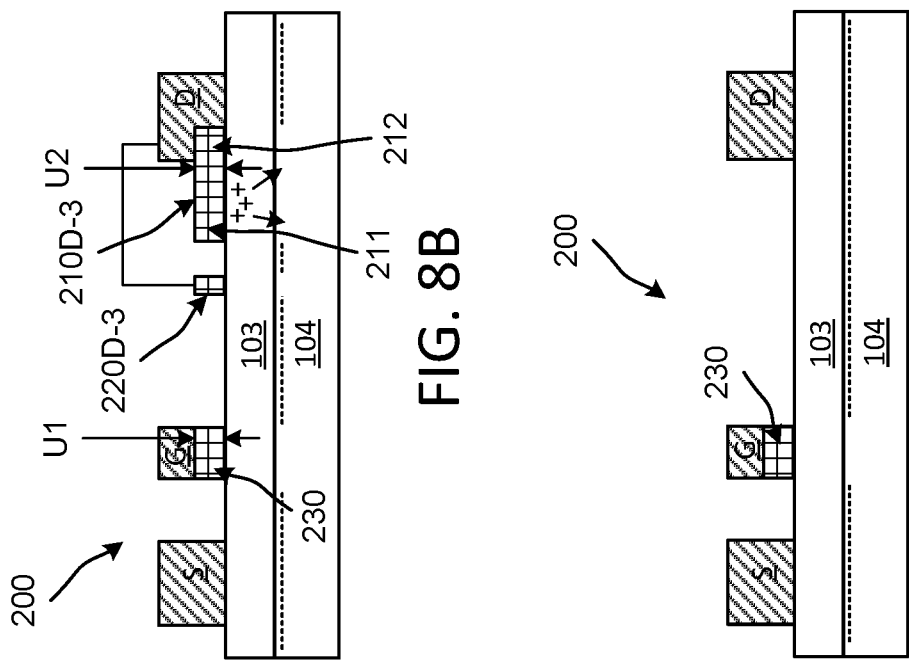
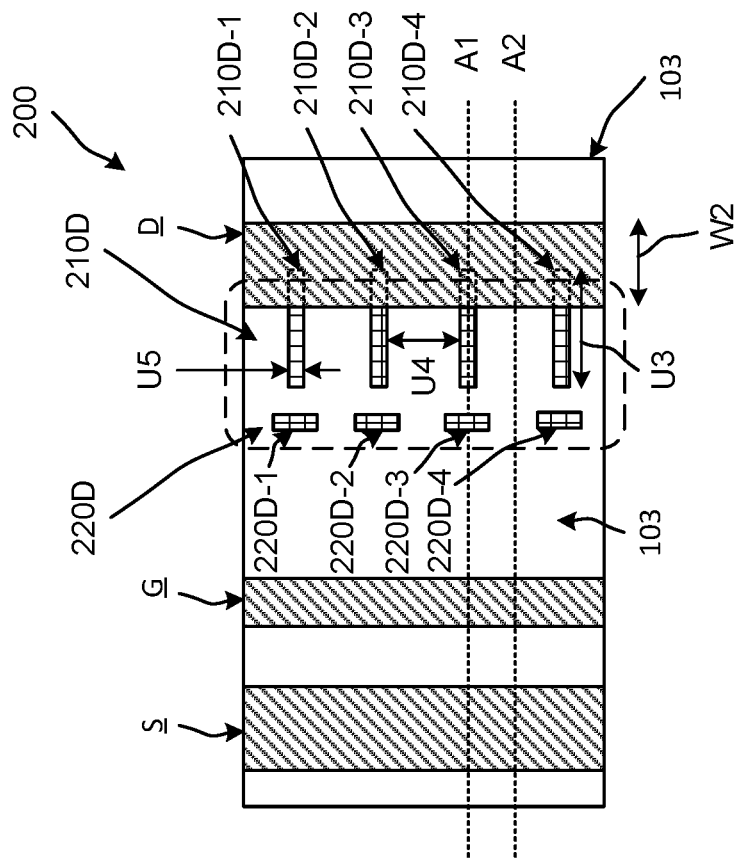
FIG. 8A
FIG. 8B
FIG. 8C

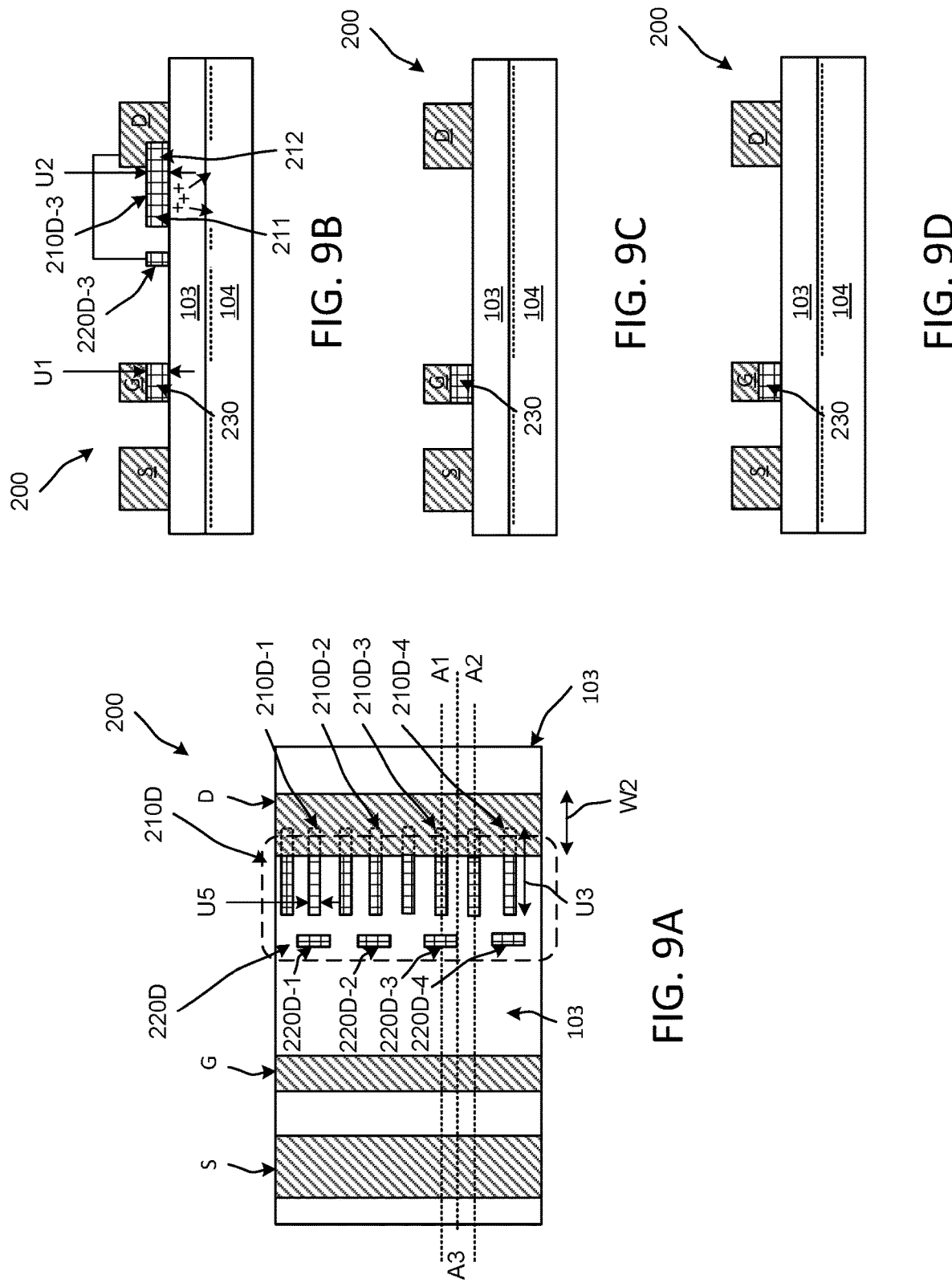

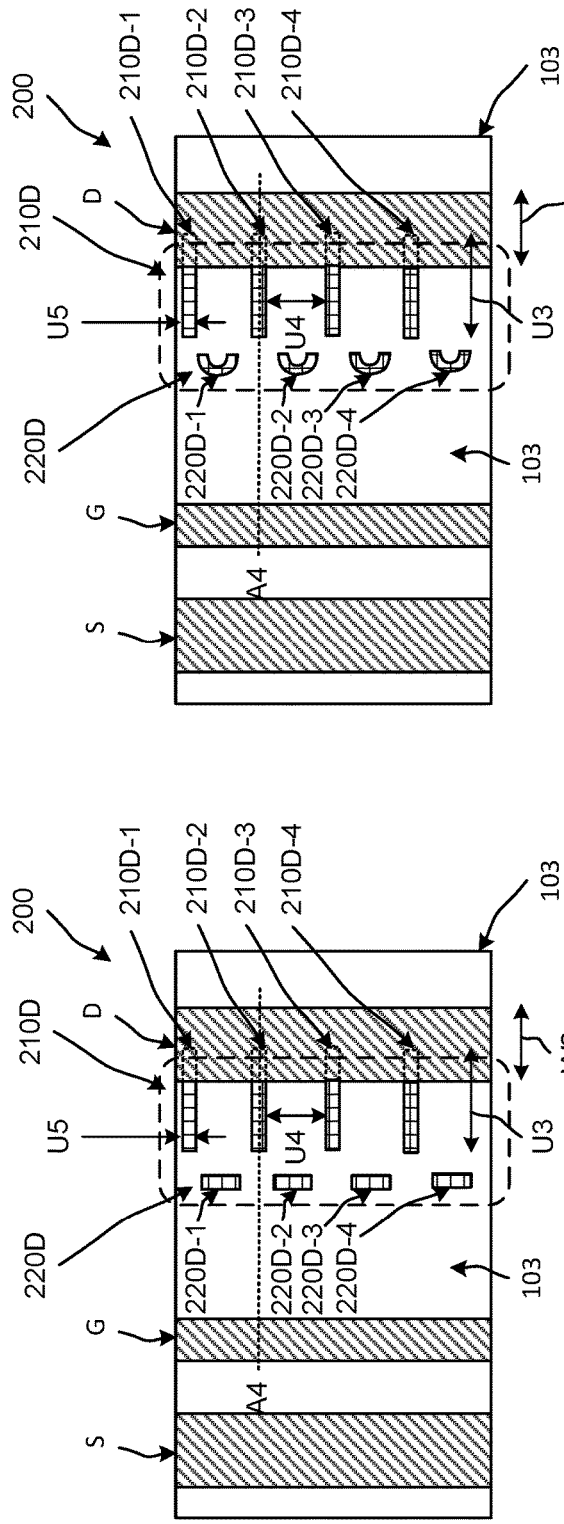
FIG. 11
FIG. 10
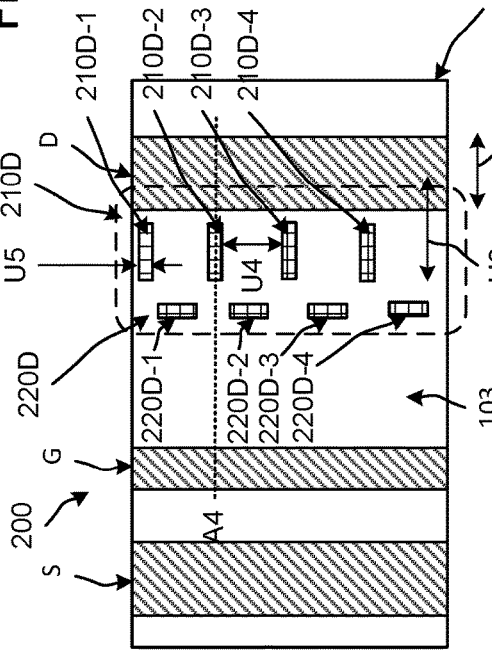
FIG. 12

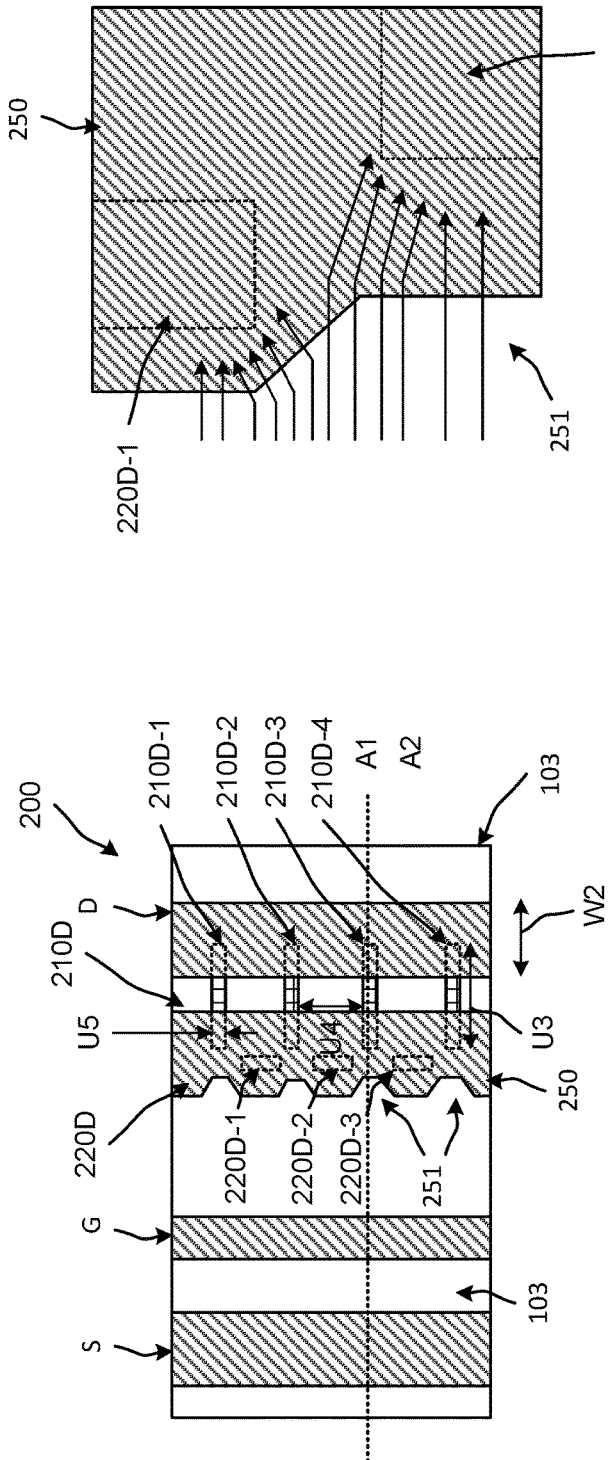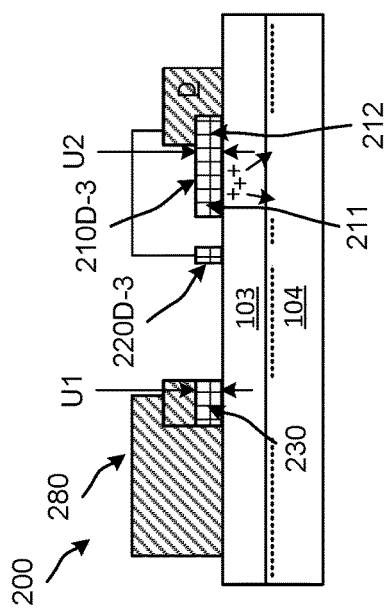
FIG. 14A
FIG. 14B
FIG. 15

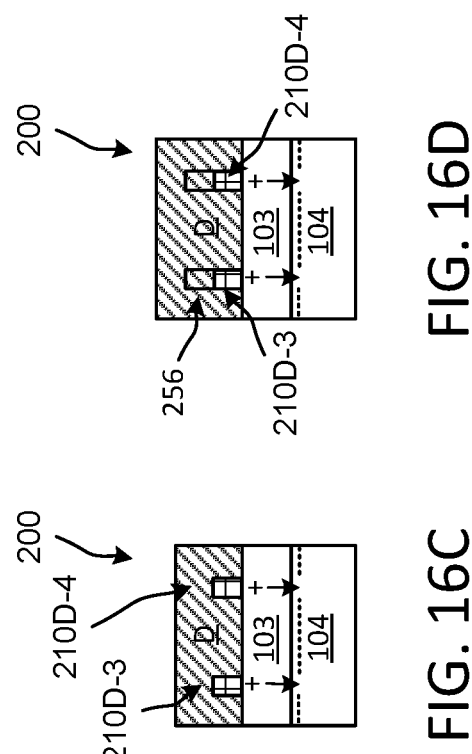
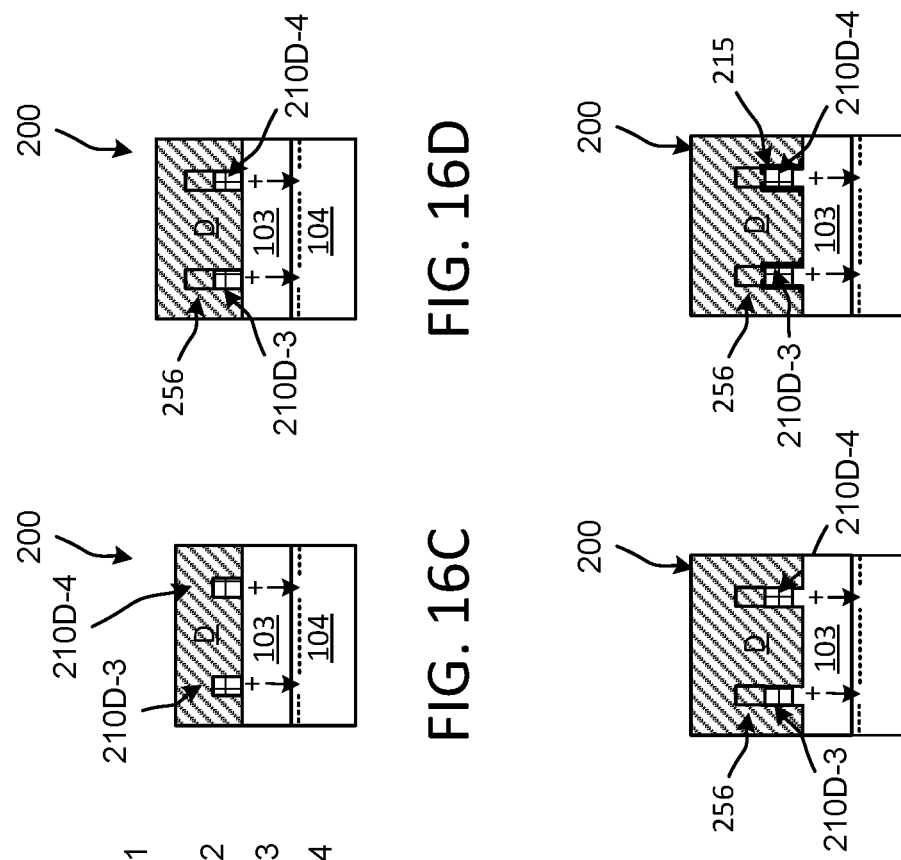
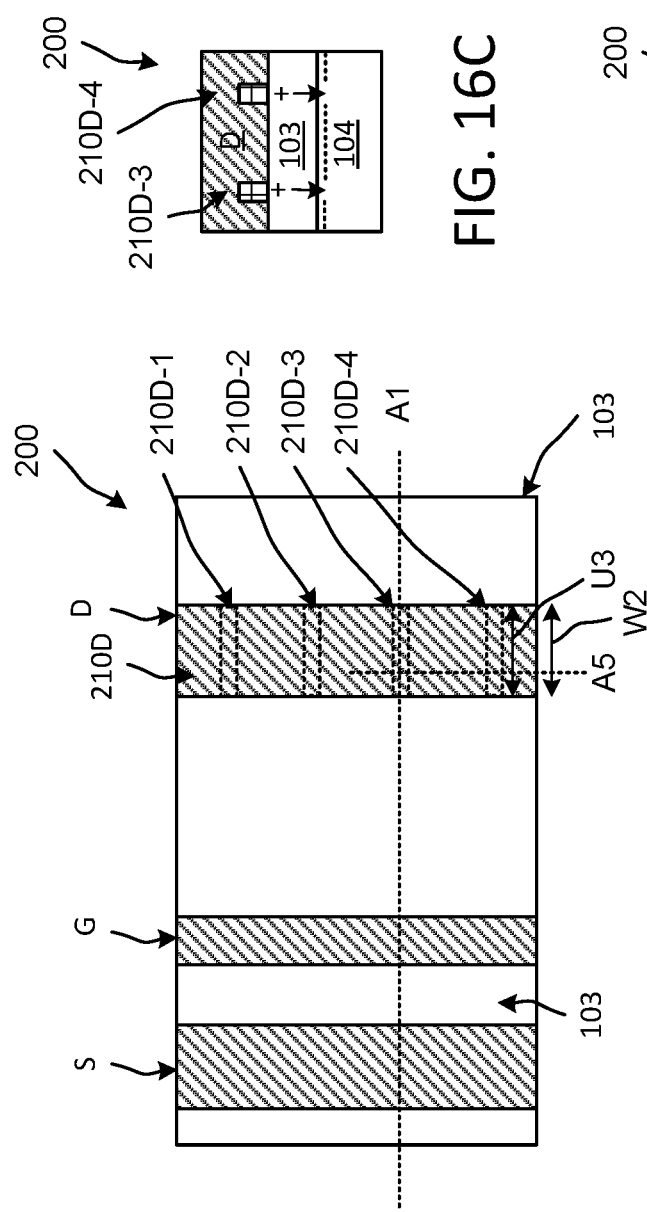
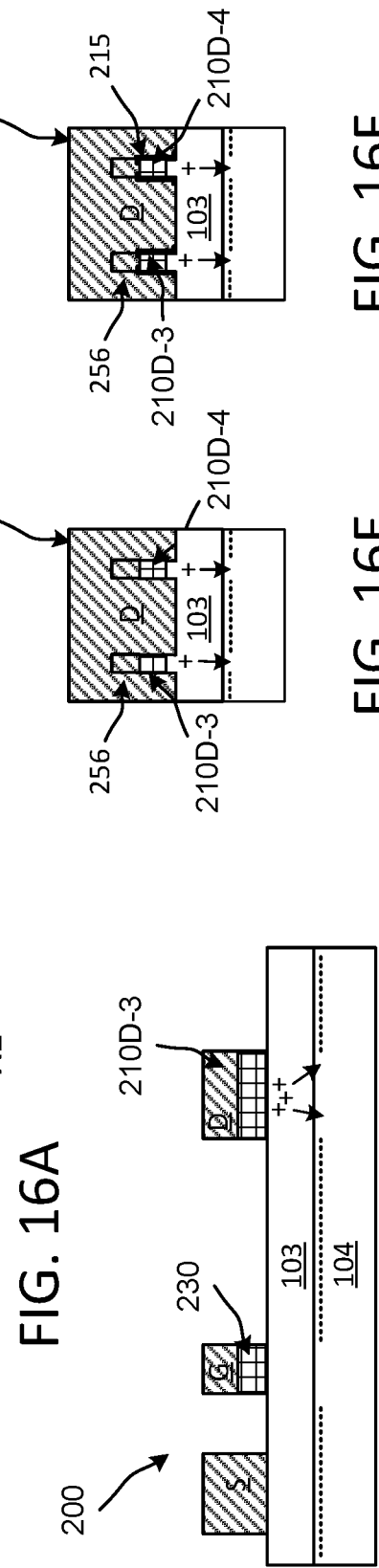

HIGH-ELECTRON-MOBILITY TRANSISTOR (HEMT) SEMICONDUCTOR DEVICES WITH REDUCED DYNAMIC RESISTANCE

RELATED APPLICATION

This application claims priority to and the benefit of U.S. Provisional Patent Application No. 62/423,547, filed Nov. 17, 2016, which is incorporated herein by reference in its entirety.

TECHNICAL FIELD

This application relates generally to semiconductor devices and methods for making such devices. More specifically, this application describes semiconductor devices including high-electron-mobility transistors (HEMT) with reduced dynamic resistance.

BACKGROUND

Semiconductor devices containing integrated circuits (ICs) or discrete devices are used in a wide variety of electronic devices. The IC devices (or chips, or discrete devices) can include a miniaturized electronic circuit that has been manufactured in the surface of a substrate of semiconductor material. The circuits are composed of many overlapping layers, including layers containing dopants that can be diffused into the substrate (called diffusion layers) or ions that are implanted (implant layers) into the substrate. Other layers are conductors (polysilicon or metal layers) or connections between the conducting layers (via or contact layers). IC devices or discrete devices can be fabricated in a layer-by-layer process that uses a combination of many steps, including imaging, deposition, etching, doping and cleaning. Silicon wafers are typically used as the substrate and photolithography is used to mark different areas of the substrate to be doped or to deposit and define polysilicon, insulators, or metal layers.

One type of semiconductor device, a high-electron-mobility transistor (HEMT), is a field-effect transistor incorporating a junction between two materials with different band gaps (i.e. a hetero-junction) as the channel instead of a doped region (as is generally the case for MOSFET devices). HEMTs can be used in integrated circuits as digital on-off switches. HEMT transistors can operate at higher frequencies than ordinary transistors and can be used in many high-frequency products, including, for example, mobile phones.

SUMMARY

High-electron-mobility transistor (HEMT) devices are described in this patent application. In some implementations, the HEMT devices can include a back barrier hole injection structure. In some implementations, the HEMT devices include a conductive striped portion electrically coupled to a drain contact.

BRIEF DESCRIPTION OF THE DRAWINGS

FIG. 1 is a diagram that illustrates an example implementation of a high-electron-mobility transistor (HEMT) device.

FIG. 2 illustrates a variation of the HEMT device shown in FIG. 1.

FIG. 3A is a diagram that illustrates a plan view of the HEMT device shown in FIG. 1.

FIG. 3B is a diagram that illustrates a variation of the HEMT device shown in FIGS. 1 and 3A.

FIG. 4 is a diagram that illustrates another variation of the HEMT device shown in FIG. 1.

FIGS. 5A through 5C illustrates a process for making the HEMT devices described herein in connection with at least FIGS. 1 through 4.

FIGS. 7A through 7D are diagrams that illustrate a HEMT device that includes conductive striped portions coupled to a drain contact.

FIGS. 8A through 8C are diagrams that illustrate a variation of the HEMT device shown in FIGS. 7A through 7D.

FIGS. 9A through 9D are diagrams that illustrate a variation of the HEMT device shown in FIGS. 8A through 8C.

FIGS. 10 through 12 are diagrams that illustrate plan views of variations of a HEMT device.

FIGS. 14A and 14B are diagrams that illustrate variations of the HEMT device shown in FIGS. 13A through 13C.

FIG. 15 illustrates a diode variation of a HEMT device.

FIGS. 16A through 16C are diagrams that illustrate variations of the HEMT device shown in FIGS. 7A through 7D.

FIGS. 16D through 16F illustrate variations of a portion of the HEMT device shown in FIGS. 16A through 16C that includes metal layer portions disposed on conductive striped portions.

Figure 6:
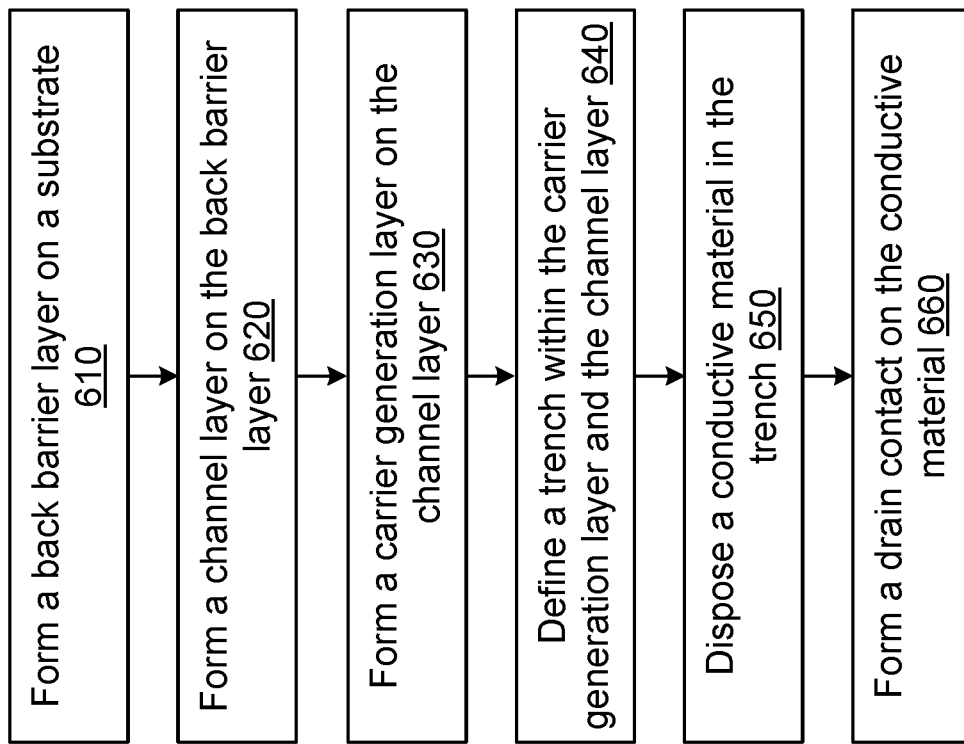
FIG. 6 is a flowchart that illustrates a method of making the HEMT devices.

The Figures illustrate specific aspects of the semiconductor devices and methods for making such devices. Together with the following description, the Figures demonstrate and explain the principles of the methods and structures produced through these methods. In the drawings, the thickness of layers and regions are exaggerated for clarity. It will also be understood that when a layer, component, or substrate is referred to as being "on" another layer, component, or substrate, it can be directly on the other layer, component, or substrate, or intervening layers may also be present. The same reference numerals in different drawings represent the same element, and thus their descriptions will not be repeated.

DETAILED DESCRIPTION

To help reduce the on resistant between a source and a drain ($RDS_{on}$) of a high-electron-mobility transistor (HEMT) device (e.g., a gallium nitride (GaN) HEMT device), the HEMT device can be configured with structures that trigger hole injection (e.g., direct back barrier hole injection) into a channel region (e.g., a 2-dimensional electron gas (2DEG)) of the HEMT device. The $RDS_{on}$ in the channel region can increase, in an undesirable fashion, for example, when the HEMT device is turned on after a relatively high voltage has been applied to the drain of the HEMT device in the off state of the HEMT device. Electrons trapped near, or within, the channel region can neutralize the carrier charges in the channel region resulting in an increased $RDS_{on}$. The increase in $RDS_{on}$ due to this mechanism can be referred to as current collapse, and can be particularly problematic when the HEMT device is turned on (e.g., is in the on state). In some implementations, $RDS_{on}$ can be increased in an undesirable fashion, in particular, where electric fields within the HEMT device are relatively high.

In some implementations, to reduce $RDS_{on}$, for example, in response to the undesirable mechanisms described above, hole injection can be triggered by various semiconductor structures below, near, or coupled to a drain and/or source of the HEMT device. In other words, various structures below, near, or coupled to a drain and/or source of the HEMT device can be used to reduce $RDS_{on}$, for example, in response to the undesirable mechanisms described above. In some implementations, $RDS_{on}$ can be reduced, for example, using direct back barrier hole injection. In some implementations, holes can be injected by using an applied voltage to the drain and/or source of the HEMT device. The structures and methods described herein can result in the generation of carriers and reduce $RDS_{on}$ by conductivity modulation. In some implementations, striped conductive structures can be implemented in HEMT devices for conductivity modulation. In some implementations, a field plate can be used to spread the electric field and reduce the $RDS_{on}$.

Throughout this detailed description enhancement mode devices (e.g., E-HEMT devices, normally-on devices) or depletion mode devices (e.g., D-HEMT devices, normally-off) are illustrated in the various embodiments. In some implementations, the depletion mode devices can be modified to be enhancement mode devices. In some implementations, the enhancement mode devices can be modified to be depletion mode devices.

FIG. 1 is a diagram that illustrates an example implementation of a high-electron-mobility transistor (HEMT) device 100. The HEMT device 100 includes a channel layer 104 vertically disposed between a carrier generation layer 103 and a buffer layer 105. The HEMT device 100 also includes a gate contact G laterally disposed between a source contact S and a drain contact D. The source contact S and the drain contact D are in contact with the carrier generation layer 103. The gate contact G is coupled to a dielectric layer 102 that is disposed on the carrier generation layer 103. The dielectric layer 102 is disposed between the drain contact D and the source contact S.

A two-dimensional electron gas (2DEG) (illustrated with a dashed horizontal line; also can be referred to as a channel) along a channel region is generated at or near the interface between the carrier generation layer 103 in the channel layer 104. In some implementations, the 2DEG gas layer can be, or can include carriers. The 2DEG can be generated based on the different in bandgap voltages between the carrier generation layer 103 and the channel layer 104. The carrier generation layer 103 can also be referred to as a high bandgap layer because the bandgap of the material of the carrier generation layer 103 can be greater than a bandgap of the channel layer 104.

As shown in FIG. 1, the HEMT device 100 includes a conductive material 110D coupled to (e.g., conductively coupled to, directly coupled to) the drain contact D. The conductive material 110D is configured to modulate conductivity associated with the 2DEG of the HEMT device 100. Specifically, the conductive material 110D is configured to trigger hole generation at or near an interface between the channel layer 104 and the back barrier layer 105. This can be referred to a back barrier hole injection (e.g., direct back barrier hole injection). The holes can be injected into or near the 2DEG, resulting in reduced $RDS_{on}$ of the 2DEG. The holes are illustrated with "+" signs, and the direction of injection is illustrated by arrows. Electrons that can be trapped near, or within, the 2DEG, and holes injected into the 2DEG can neutralize the electron charges resulting in a more favorable $RDS_{on}$. In some implementations, the lifetime of the HEMT device 100 can be increased by preventing or reducing dynamic $RDS_{on}$ increase.

Figure 17:
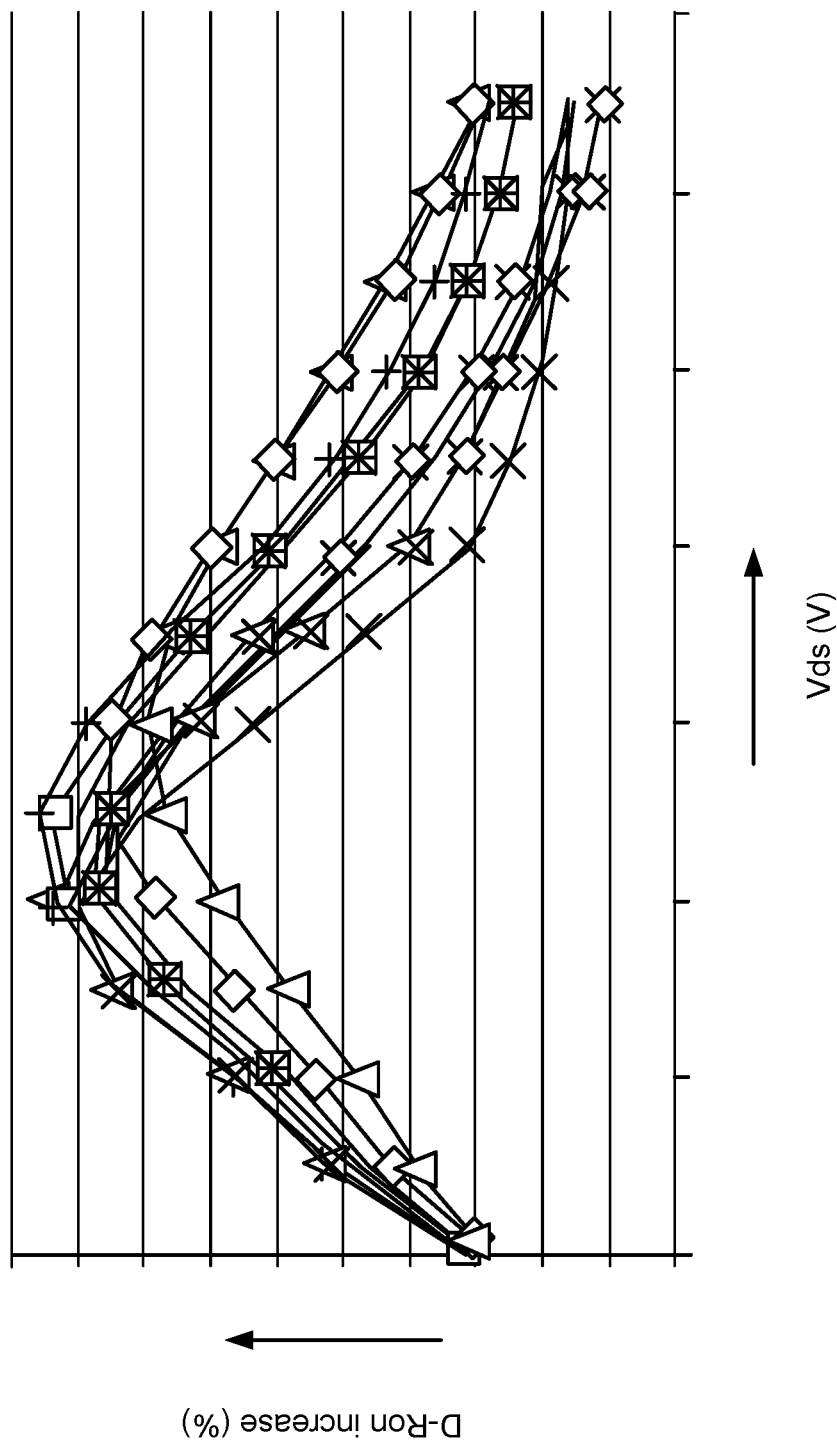
FIG. 17 through 21B are graphs that illustrate performance of HEMT devices according to implementations described herein.

Using direct back barrier hole injection can help compensate the increase of dynamic $RDS_{on}$ (also can be referred to as $D-R_{on}$ or as $D-RDS_{on}$). By injecting holes using the applied voltage to the drain contact D, the injected holes can generate more carriers and reduce dynamic $RDS_{on}$ by conductivity modulation. This can address the dynamic $RDS_{on}$ shifting in a HEMT device after applying a high voltage after, for example, long term reliability test (such as high temperature reverse bias (HTRB)). Dynamic on-resistance increase percentage versus VDS voltage is shown in FIG. 17.

As shown in FIG. 1, the conductive material 110D has at least a portion disposed within the carrier generation layer 103. The conductive material 110D also has at least a portion disposed within the channel layer 104. The conductive material 110D is disposed within a trench (e.g., a vertical trench, a recess) within the carrier generation layer 103 and the channel layer 104. Because the conductive material 110D is disposed within a trench, the conductive material can be referred to as trench conductive material. In this implementation, the conductive material 110D directly contacts (e.g., is not insulated from) the back barrier layer 105. The conductive material 110D is not insulated from the carrier generation layer 103 and/or the channel layer 104.

The HEMT device 100 is configured so that the hole generation is triggered when the HEMT device 100 is in an off-state. The HEMT device 100 shown in FIG. 1 is a depletion mode (DHEMT) device. Accordingly, the HEMT device 100 is a normally-on device and is turned off by applying a voltage lower than a threshold voltage of the HEMT device 100 (e.g., negative voltage in some implementations) to the gate contact G. When in the off-state a voltage can be applied to the drain contact D (e.g., a drain voltage) that is higher than a voltage applied to the gate contact G (also can be referred to as a gate voltage) or the source contact S (also can be referred to as a source voltage). Accordingly, both VDG (voltage from drain to gate) and VDS (voltage from drain to source) can be positive. The voltage applied to the drain contact D can cause holes to be generated at the interface between the conductive material 110D and the back barrier layer 105. In some implementations, the hole generation within the HEMT device 100 can be greater with higher voltages (e.g., higher voltages at the drain contact D) and higher temperatures.

The voltage gradient (e.g., potential gradient) between the drain contact D (and the conductive material 110D) and the gate contact G can cause the holes to accelerate in the direction shown (e.g., toward the gate). For example, a voltage at the drain contact D (and conductive material 110D) can be approximately 400V and the voltage at gate can be, for example, −10 V. Accordingly, the holes will be accelerated from the location of high potential (e.g., drain contact D and conductive material 110D) toward the location of low potential (e.g., gate contact G).

The HEMT device 100 is in an on-state when a positive voltage is applied between the drain and the source (e.g., VDS). The HEMT device 100 is a normally-on device so it in an on-state when higher than a threshold voltage (e.g., 0V, 1V, 5V etc.) is applied to the gate contact G. In some implementations, a voltage applied to the gate contact G can change the depth of the depletion region under the dielectric below the gate contact G so that drain current can be controlled.

The HEMT device 100 described herein can have a relatively narrow trench at the drain contact D ohmic contact area. As holes can be injected to the channel region when the drain contact D potential is high, the holes will add more 2DEG density and lower dynamic $RDS_{on}$. The lower dynamic $RDS_{on}$ can be due to the hole injection near the drain contact D area. These configurations can also extend the lifetime of the HEMT device 100 by preventing $RDS_{on}$ increase. The trench in the drain contact D area can be narrow enough so that the trench does not degrade the drain contact D resistance. The HEMT device 100 in these embodiments can have a straight line or an array of small contacts.

In some implementations, the conductive material 110D can terminate within the channel layer 104 and can terminate above (e.g., vertically above) the back barrier layer 105. In some implementations, a relatively high temperature anneal (e.g., a greater than 600° C. anneal, a 850° C. anneal) can be used to drive a bottom portion of the conductive material 110D toward, or into, the back barrier layer 105.

In some implementations, the conductive material 110D can terminate at an interface between the back barrier layer 105 and the channel layer 104. In some implementations, the conductive material 110D can terminate within the back barrier layer 105 and below (e.g., vertically below) the channel layer 104.

In some implementations, the substrate 106 can include a silicon substrate, a silicon carbide (SiC) substrate, and so forth. In some implementations, the back barrier layer 105 can be, or can include, a doped portion of the substrate. In some implementations, the back barrier layer 105 can be, or can include an epitaxial layer. In some implementations, the back barrier layer, as an epitaxial layer, under the 2DEG can prevent electron flow to substrate 106.

In some implementations, the source contact S and/or the drain contact D can be an Ohmic contact. In this implementation, the source contact S and the drain contact D are disposed on the carrier generation layer 103. In some implementations, the source contact S and/or the drain contact D may be recessed in (e.g., can be disposed within) the carrier generation layer 103.

In this implementation, the gate contact G is disposed in a recess within the dielectric layer 102. In some implementations, the gate contact G may not be recessed within the dielectric layer 102.

As mentioned above, the carrier generation layer 103 can have a bandgap greater than a bandgap of the channel layer 104. For example, the channel layer 104 can include, or can be, an undoped or doped GaN material. In some implementations, the AlGaN material can include aluminum content between approximately 1-8%. The carrier generation layer 103 can include, or can be, an undoped or doped AlGaN material (e.g., with aluminum content between approximately 10-30%). Accordingly, the HEMT device 100 can be a AlGaN/GaN heterostructure.

As shown in FIG. 1, the width W1 of the conductive material 110D is less than a width W2 of the drain contact D. The width W1 of the conductive material 110D and the width W2 of the drain contact D can be defined so that the resistance of the Ohmic contact of the drain contact D is not adversely affected. In some implementations, the drain contact D and the trench in which the conductive material 110D is disposed are aligned along the same direction (into the page). A plan view that illustrates this alignment is shown in at least FIG. 3A.

FIG. 2 illustrates a variation of the HEMT device 100 shown in FIG. 1. In FIG. 1, the source contact S is coupled to a conductive material 1105. The conductive material 1105 is similar to the conductive material 110D coupled to the drain contact D, and can have any of the attributes described in connection with the conductive material 110D. The conductive material 1105, like the conductive material 110D can, inject holes (shown as "+" with arrows) into the 2DEG when a voltage of the source contact S is higher than a voltage of the gate voltage G. The conductive material 1105, like the conductive material 110D can, terminate in the channel layer 104, at an interface between the channel layer 104 and the back barrier layer 105, or in the back barrier layer 105. The implementations shown in FIG. 2 can be referred to as a cascode configuration.

The conductive material 1105 can be different than the conductive material 110D. For example, a trench associated with the conductive material 1105 can have a different profile (e.g., depth, width) than a trench associated with the conductive material 110D. A voltage gradient between the source contact S and gate contact G can be less than a voltage gradient between the drain contact D and the gate contact G.

FIG. 3A is a diagram that illustrates a plan view (e.g., a top view) of the HEMT device 100 shown in FIG. 1 (view along direction T1 shown in FIG. 1). As shown in FIG. 1, the conductive material 110D is aligned along the same direction that the drain contact D is aligned. Specifically, the conductive material 110D is disposed within a trench that is aligned along the same direction that the drain contact D is aligned.

FIG. 3B is a diagram that illustrates a variation of the HEMT device 100 shown in FIGS. 1 and 3A. As shown in FIG. 3B, the conductive material 110D includes conductive material portions 110D-1 through 110D-7 (also can be referred to as an array of contacts or as islands) that are aligned along the same direction that the drain contact D is aligned. Each of the conductive material portions 110D-1 through 110D-7 is disposed in a separate trench. Accordingly, mesas (e.g., mesa portions) are disposed between the conductive material portions 110D-1 through 110D-7. Although not shown in FIGS. 3A and 3B, the features described in connection with FIGS. 3A and 3B can be implemented with the source contact S.

FIG. 4 is a diagram that illustrates another variation of the HEMT device 100 shown in FIG. 1. In this implementation, conductive material 110D includes at least one spike. The spikes illustrates in FIG. 4 do not contact directly the back barrier layer 105. In some implementations, a relatively high temperature anneal (e.g., a greater than 600° C. anneal, a 850° C. anneal) can be used to produce or enhance the conductive material 110D from the drain contact D toward the back barrier layer 105. In some implementations, the anneal can be a relatively long anneal (e.g., 10-30 s at 850° C.). The features described in connection with FIG. 4 can be implemented with the source contact S.

FIGS. 5A through 5C illustrates a process for making the HEMT devices 100 described herein in connection with at least FIGS. 1 through 4. Many of the process steps described in connection with FIGS. 5A through 5C can be applied to the embodiments described below as well.

As shown in FIG. 5A, the back barrier layer 105 can be disposed on the substrate 106. If the back barrier layer 105 is an epitaxial layer, the back barrier layer 105 can be grown on the substrate 106. The channel layer 104 can be formed on the back barrier layer 105. The carrier generation layer 103 can be formed on the channel layer 104.

As shown in FIG. 5B, a trench 109 (also can be referred to as an opening) is formed in the carrier generation layer 103 and in the channel layer 104. In this implementation, the trench 109 terminates at an interface between the channel layer 104 and the back barrier layer 105. In some implementations, the trench 109 can terminate in the channel layer 104 or in the back barrier layer 105. The trench 109 can be formed using, for example, a masking and etch process.

As shown in FIG. 5C, the conductive material 110D is disposed in the trench 109. If the trench 109 terminates within the channel layer 104, an anneal process can be performed so that the conductive material 110D can be driven to a deeper depth within the channel layer 104 or into the back barrier layer 105. In some implementations, a width of the trench 109 is less than a depth (e.g., vertical depth) of the trench 109.

The drain contact D is disposed on the conductive material 110D and the carrier generation layer 103. The source contact S is also disposed on the carrier generation layer 103. The source contact S and the drain contact D can be formed using the same process. The dielectric layer 102 is disposed on the carrier generation layer 103, and the gate contact G is disposed on the dielectric layer 102 (e.g., disposed in an etched recess portion within the dielectric layer 102).

The process described in connection with FIGS. 5A through 5C can be implemented with the source contact S. In some implementations, the gate dielectric layer 102 (also can be referred to as a gate dielectric layer) can be excluded. In some implementations, a doped material (e.g., pGaN) can be formed below (e.g., before) the gate contact G.

FIG. 6 is a flowchart that illustrates a method of making the HEMT devices 100. The method shown in FIG. 6 includes forming a back barrier layer on a substrate (block 610), and forming a channel layer on the back barrier layer (block 620). A carrier generation layer is formed on the channel layer (block 630). A trench defined within the carrier generation layer and the channel layer (block 640). In some implementations, the trench can terminate in the channel layer or in the back barrier layer. The trench can be formed using, for example, a masking and etch process. The mask for the trench can have a width that is narrower than an Ohmic contact width of the drain contactD. A conductive material is disposed in the trench (block 650), and a drain contact is formed on the conductive material (block 660). In some implementations, if the trench terminates within the channel layer, an anneal process can be performed so that the conductive material can be driven to a deeper depth within the channel layer or into the back barrier layer.

In some implementations, a source contact and the drain contact can be formed using the same process. A dielectric layer can be disposed on the carrier generation layer, and a gate contact can be disposed on the dielectric layer. The method described in connection with FIG. 6 can be implemented with a source contact. In some implementations, the gate dielectric layer can be excluded. In some implementations, a doped material (e.g., pGaN) can be formed below (e.g., before) the gate contact.

FIGS. 7A through 7D are diagrams that illustrate a HEMT device 200 that includes conductive striped portions 210D coupled to (e.g., electrically coupled to) a drain contact D. FIG. 7A is a plan view (e.g., a top view), FIG. 7B is a side cross-sectional view along line A1 FIG. 7A, and FIG. 7C is a side cross-sectional view along line A2. The HEMT device 200 shown in FIGS. 7A through 7C is an EHEMT device or normally off device. The elements that are the same as those described above have the same labels. Elements such as a back barrier layer and substrate are not shown to simplify the drawings.

The conductive striped portions 210D include conductive striped portions 210D-1 through 210D-4. The conductive striped portions 210D are striped portions. In other words, the HEMT device 200 includes a stripe patterned conductive striped portions 210D at the drain contact D area. The conductive materials portions 210D are aligned parallel to one another. For example, conductive striped portion 210D-1 is aligned parallel to conductive striped portion 210D-2.

In this implementation, the $RDS_{on}$ can be reduced by using the conductive striped portions 210D in the drain contact D of HEMT device 200. By injecting holes from the conductive striped portions 210D at the edge of the drain contact D of HEMT device 200, electrons can be generated. This configuration can compensate for the increase of D-Ron at high voltage. As the conductive striped portions 210D inject holes when the drain contact D potential is high, more 2DEG density can be added and the dynamic $RDS_{on}$ can be reduced. Lower dynamic $RDS_{on}$ can be attributed to the hole injection near (e.g., below) the conductive striped portions 210D and the drain contact D area. This configuration can also extend the lifetime of the HEMT device 200 by preventing or reducing dynamic $RDS_{on}$ increase. The conductive striped portions 210D can be in a striped pattern so that they do not increase the total $RDS_{on}$.

Figure 18B:
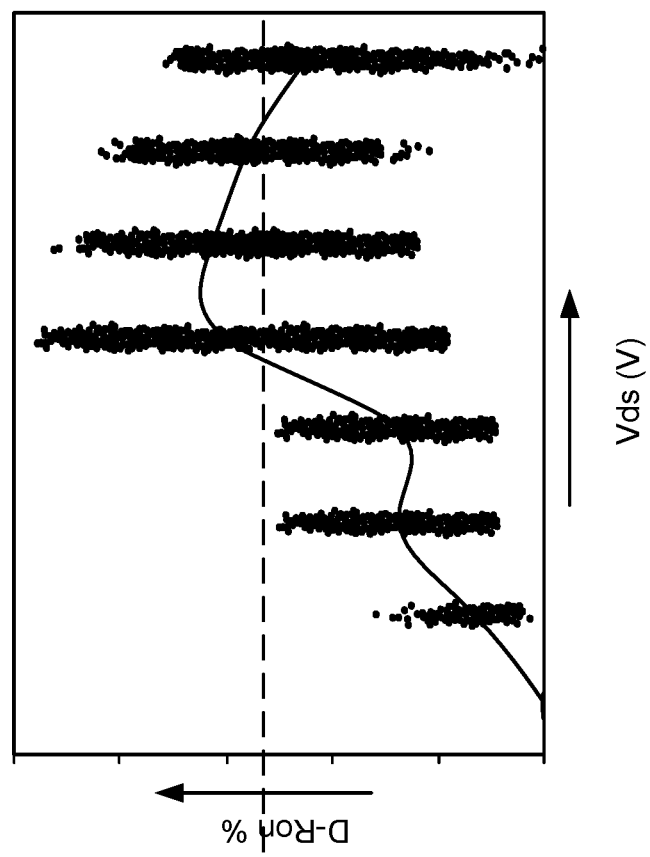
Figure 18A:
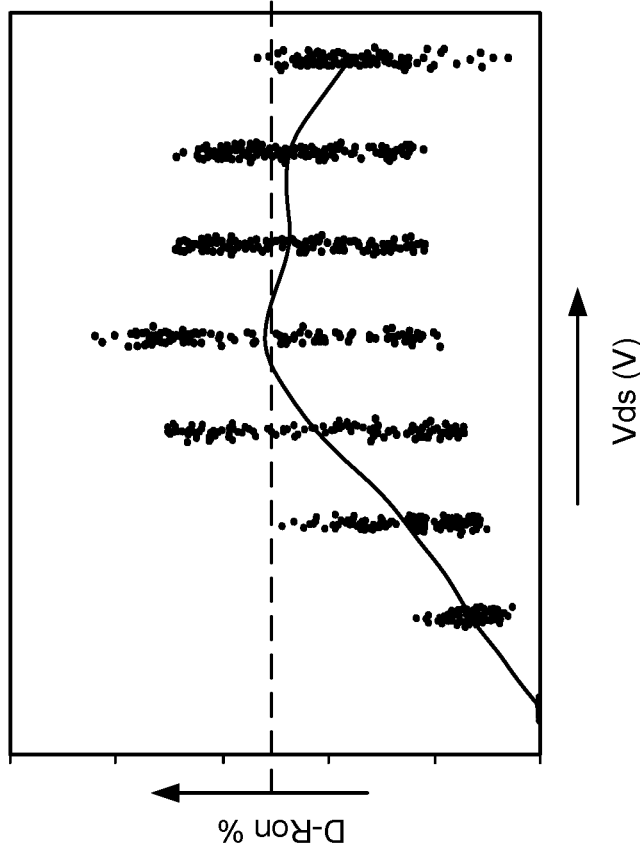
Figure 19A:
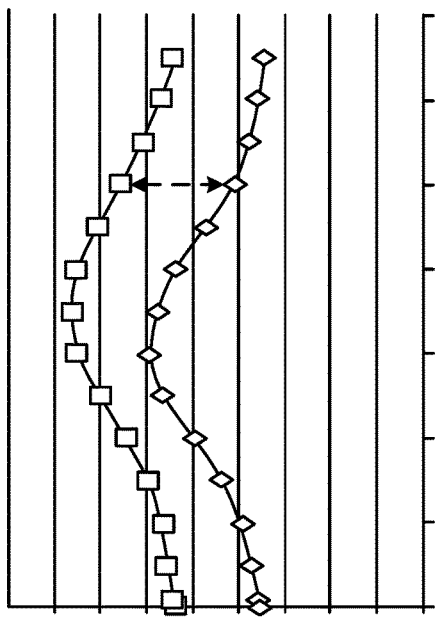
Figure 19B:
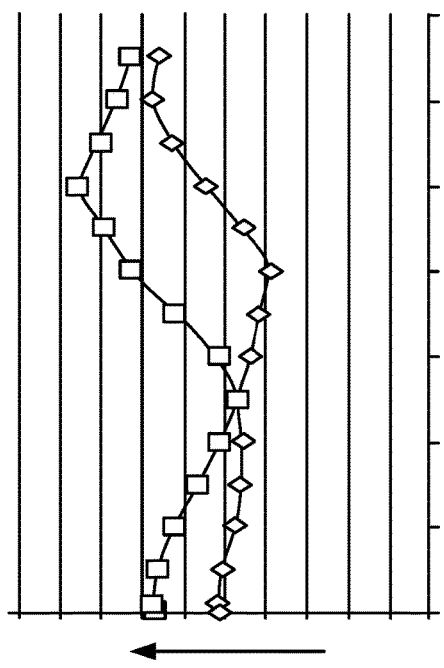
Figure 19C:
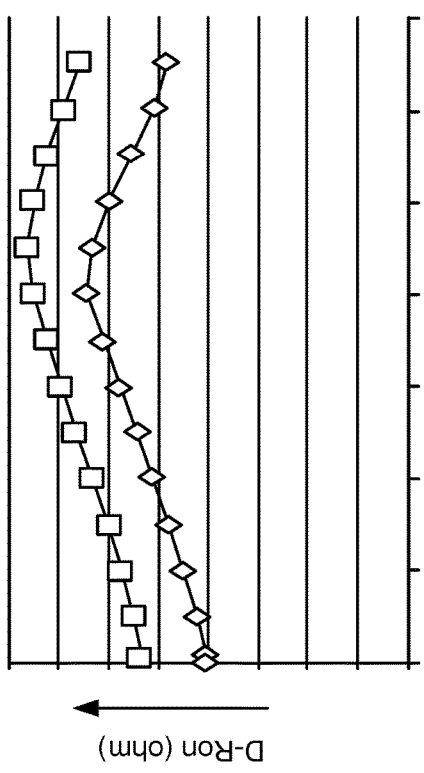
Figures 20A, 20B:
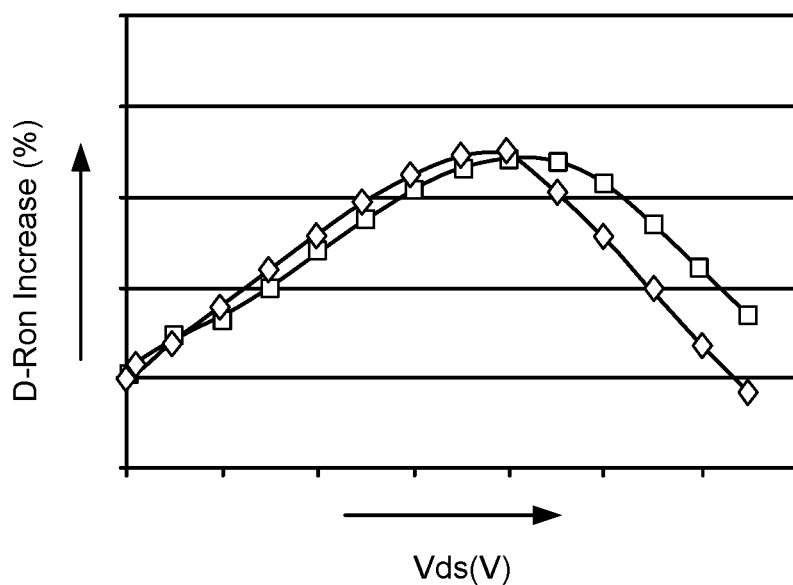
Figure 21A:
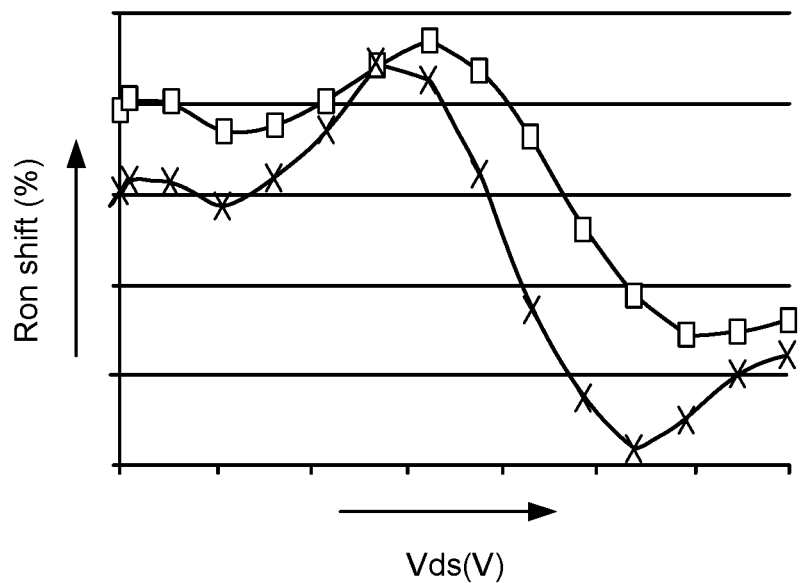
Figure 21B:
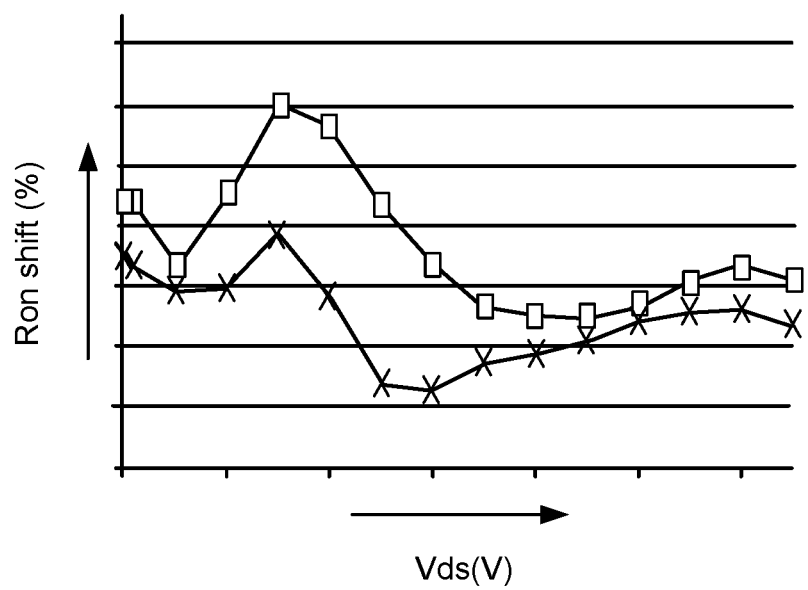

The dynamic on-resistance (D-Ron) increase percentage versus VDS voltage for a striped HEMT device is illustrated in FIG. 18A and can be compared with dynamic on-resistance (D-Ron) increase percentage versus VDS voltage for a normal E-HEMT device shown in FIG. 18B. FIG. 19A illustrates initial dynamic on-resistance for a typical HEMT device (shown with squares) and a striped HEMT device (shown with diamonds). FIG. 19B illustrates increased separation in dynamic on-resistance for the typical HEMT device and the striped HEMT device after stress testing (e.g., high temperature reverse bias (HTRB) test at, for example, more than 1000 hrs.). FIG. 19C illustrates dynamic on-resistance percentage difference (different from FIG. 19A to FIG. 19B) for the typical HEMT device and the striped HEMT device after stress testing. FIG. 20A illustrates dynamic on-resistance increase percentage for a typical HEMT device (shown with squares) and a striped HEMT device (shown with diamonds) at 25° C. FIG. 20B illustrates dynamic on-resistance increase percentage for the typical HEMT device and the striped HEMT device at 150° C. and after stress testing. FIG. 21A illustrates on-resistance percentage shift for a typical HEMT device (shown with squares) and a striped HEMT device (shown with X's) at 25° C. and after stress testing. FIG. 21B illustrates on-resistance percentage shift for the typical HEMT device and the striped HEMT device at 150° C. and after stress testing. These figures illustrate that the striped HEMT devices have lower dynamic $RDS_{on}$ at high voltage. These configurations can also exhibit lower shift and/or lower dynamic $RDS_{on}$ after stress testing, which can extend the lifetime of the HEMT devices.

In this implementation, the conductive striped portions 210D are on disposed on a surface of the carrier generation layer 103. Accordingly, the conductive striped portions 210D are not recessed in the carrier generation layer 103. In some implementations, the conductive striped portions 210D can be recessed at least some amount within the carrier generation layer 103 (and/or the channel layer 104).

The conductive striped portions 210D each have a least a portion disposed under the drain contact D. For example, as shown in FIG. 7B, the conductive striped portion 210D-3 has a portion 211 that is disposed outside of the drain contact D (is disposed outside of a vertical projection of the drain contact D). The conductive striped portion 210D-3 has a portion 212 disposed below at least a portion (or within a portion) of the drain contact D. In other words, the portion 212 of the conductive striped portion 210D-3 is disposed between a portion of the drain contact D and a top surface of carrier generation layer 103.

As shown in FIG. 7B, a spacer 230 is disposed between gate contact and the carrier generation layer 103. The spacer 230 can be made of the material that is the same as the material one or more of the conductive striped portions 210D. In some implementations, the spacer 230 and/or the conductive striped portions 210D can be made of a doped material. In some implementations, the spacer 230 and/or the conductive striped portions 210D can be made of a doped gallium nitride material (e.g., p-type doped GaN (pGaN)).

In some implementations, a thickness U1 of the spacer 230 can be the same as a thickness U2 of one or more of the conductive striped portions 210D. In some implementations, the thickness U1 of the spacer 230 can be different than (e.g., greater than, less than) the thickness U2 of one or more of the conductive portions 210D. In some implementations, the thickness U2 of one or more of the conductive striped portions 210D can also be thinner than the thickness U1 of the spacer 230 to further minimize dynamic $RDS_{on}$ increase.

As shown in FIG. 7A, in some implementations, a length U3 of one or more of the conductive striped portions 210D can be greater than a width W2 of the drain contact D. The length U3 of one or more of the conductive striped portions 210D can be defined to minimize or reduce current collapse within predefined voltage ranges (e.g., reduce current collapse at a switching voltage of ~400V for a 650V HEMT device).

In some implementations, a spacing (e.g., spacing U4 between conductive striped portions 210D-2, 210D-3) between the stripes of the conductive striped portions 210D can be defined so that overall dynamic $RDS_{on}$ increase of the HEMT device 200 can be decreased or minimized. In some implementations, the spacing U4 (e.g., 10 microns) can be less than (e.g., 2 times less, 5 times less, 10 times less) the length U3 (e.g., 1-2 microns).

In some implementations, a width (e.g., width U5 of conductive striped portion 210D-1) of the stripes of the conductive striped portions 210D can be defined so that overall dynamic $RDS_{on}$ increase of the HEMT device 200 can be decreased or minimized. A distance between ends of the conductive striped portions 210D and the gate contact G (e.g., distance U6) can be defined so that operation of the HEMT device 200 is not adversely affected. The conductive striped portions 210D of the HEMT device 200 can have a width, length, and spacing that can be varied depending on the end use of the HEMT device 200 and the typical cut-off voltage.

FIG. 7C illustrates that in spaces between the conductive striped portions 210D (e.g., along cut line A2), holes are not generated. Accordingly, the 2DEG layer below the drain contact D area (illustrated with a dashed line) is not disrupted.

In some implementations, the conductive striped portions 210D (or a portion thereof) can be separated (e.g., separated by a gap) from the drain contact D. Accordingly, in such implementations a portion of the conductive striped portions 210D may not be disposed (e.g., portion 212 of the conductive striped portion 210D-3 may not be disposed) below the drain contact D. In such implementations, the drain contact D can be conductive coupled to (e.g., coupled to each of) the conductive striped portions 210D via, for example, a metal layer(s), a via, and/or so forth.

FIG. 7D is a diagram that illustrates multiple cells of a variation of the HEMT device 200. As shown in FIG. 7D, conductive striped portions 210D extend out from both sides of the drain contact D. Portions of the conductive striped portions 210D extending from a first side of the drain contact D are associated with a first cell (e.g., left side) of the HEMT device 200 and portions of the conductive striped portions 210D extending from a second side (e.g., right side) of the drain contact D are associated with a second cell of the HEMT device 200.

FIGS. 8A through 8C are diagrams that illustrate a variation of the HEMT device 200 shown in FIGS. 7A through 7D. Elements that were described above (and variations thereof) are not described again in connection with FIGS. 8A through 8C.

In this implementation, conductive transverse portions 220D are disposed between the conductive striped portions 210D and the gate contact G. The conductive transverse portions 220D reduce electric fields that may be generated at the ends of the conductive striped portions 210D (e.g., ends distal to the drain contact D, ends facing toward the gate contact G).

As shown in FIG. 8A, each of the conductive transverse portions 220D are aligned a long a line (e.g., substantially aligned a line) that is non-parallel to (e.g., orthogonal to) each of the conductive striped portions 210D. In some implementations, at least a first portion of the conductive transverse portions 220D can be aligned a long a first line and at least a second portion of the conductive transverse portions 220D can be aligned a long a second line. In some implementations, the first line and the second line can be parallel or non-parallel. In some implementations, the first line and the second line can be non-parallel to (e.g., orthogonal to) each of the conductive striped portions 210D.

The drain contact D (or the conductive striped portions 210) can be conductive coupled to the conductive transverse portions 220D (e.g., via a metal layer(s), a via, etc.). Such conductive coupling between conductive transverse portions 220D and the drain contact D is illustrated in FIG. 8B. In some implementations, one or more of the conductive transverse portions 220D are made of the same material as one or more of the conductive striped portions 210D.

In some implementations, one or more of the conductive transverse portions 220D can be coupled to (e.g., electrically coupled to) one or more of the conductive striped portions 210D. As shown in FIG. 8B a thickness of the conductive transverse portions 220D can be the same as (or different from) the thickness of the conductive striped portions 210D. The conductive striped portions 210D can be formed using the same process as the conductive transverse portions 220D.

In some implementations the ratio of a number of the conductive transverse portions 220D can be equal to a number of the conductive striped portions 210D. In other words, a conductive transverse portion 220D can correspond with each conductive striped portion 210D. In some implementations the ratio of a number of the conductive transverse portions 220D can be different from (e.g., greater than, less than) a number of the conductive striped portions 210D.

FIGS. 9A through 9D are diagrams that illustrate a variation of the HEMT device 200 shown in FIGS. 8A through 8C. Elements that were described above (and variations thereof) are not described again in connection with FIGS. 9A through 9D. In this implementation, additional conductive striped portions 210D are included in the set of conductive striped portions. Accordingly, a number of the conductive striped portions 210D is greater than (e.g., 2 times greater than) a number of the conductive transvers portions 220D.

FIG. 10 is a diagram that illustrates a plan view yet another variation (which can include any of the variations above) of the HEMT device 200. In this implementation, the conductive striped portions 210D are aligned in the spaces between the conductive transverse portions 220D. For example, conductive striped portion 210D-2 is aligned along a line A4 that intersects a space or opening between the conductive transverse portion 220D-1 and the conductive transverse portion 220D-2.

FIG. 11 is a diagram that illustrates a plan view a variation (which can include any of the variations above) of the HEMT device 200 shown in FIG. 10. The conductive striped portions 210D are aligned in the spaces between the conductive transverse portions 220D. The conductive transverse portions 220D also each have a curved shape. In this implementation, concave portions of the curved shapes are facing toward the drain contact D. In some implementations, one or more of the conductive transverse portions 220D can have a non-curved shape. In some implementations, one or more of the conductive transverse portions 220D can be aligned with one or more of the conductive striped portions 210D (e.g., as shown in FIG. 8A).

FIG. 12 is a variation of the HEMT device 200 of FIG. 10. In this implementation, the conductive striped portions 210D are separated (e.g., separated by a gap) from the drain contact D. In some implementations, one or more of the conductive transverse portions 220D can have a curved shape.

Figure 13B:
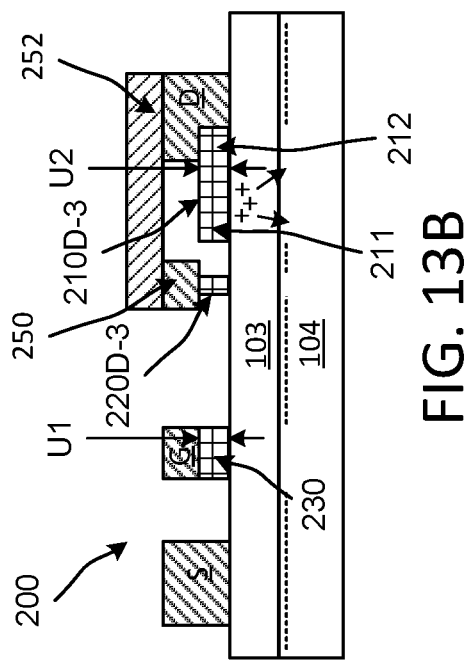
FIG. 13A through 13C are diagrams that illustrates a variation of the HEMT device shown in at least FIG. 8A.
Figure 13C:
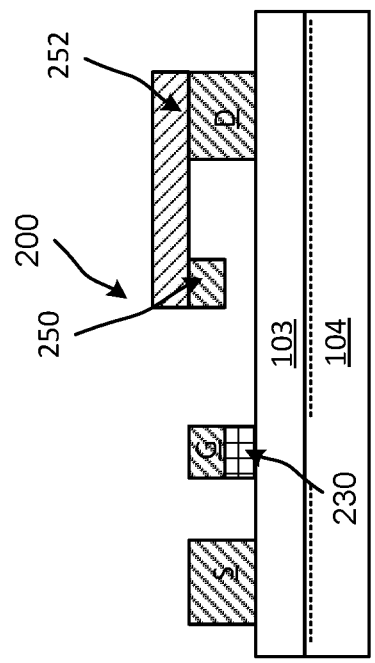
Figure 13A:
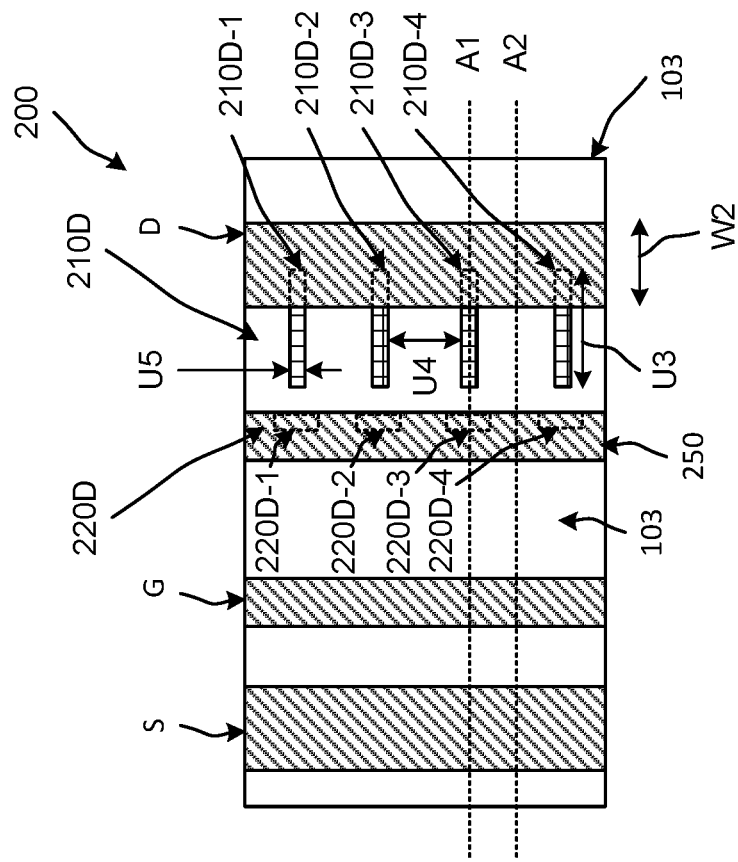

FIG. 13A through 13C are diagrams that illustrates a variation of the HEMT device 200 shown in at least FIG. 8A. The features of the variations of any of FIGS. 7A-7D and 9A-12 can be combined with FIGS. 13A through 13C. In this implementation, a field plate 250 is coupled to the tops of the conductive transverse portions 220D. The field plate 250 can be made of the same metal as the gate contact G. As shown in FIGS. 13B and 13C, the field plate 250 can be coupled to the drain contact D via a metal layer 252 (e.g., a metal M1 layer). The metal layer 252 is not shown in FIG. 13A. The field plate 250 can be configured to reduce (e.g., redistribute) the electric field associated with the conductive striped portions 210D and/or the conductive transverse portions 220D.

FIGS. 14A and 14B are diagrams that illustrate variations of the HEMT device 200 shown in FIGS. 13A through 13C. This implementation includes a field plate 250 that has recesses 252 that can be configured to re-direct portions of an electric field associated with the conductive striped portions 210D and/or the conductive transverse portions 220D. In this implementation, the recesses 252 are disposed between the conductive transverse portions 220D. The recesses 252 have a trapezoidal shape. Other shapes such as semi-circles, rectangles, etc. can also be implemented. The directions of the electric field are illustrated in the zoomed in portion shown in FIG. 14B associated with conductive transverse portion 220D-1 and conductive striped portion 210D-2. This type of field plate structure can be combined with any of the embodiments described above.

FIG. 15 illustrates a diode variation of the HEMT device 200. The source contact S is coupled to the gate contact G to define a source cathode 280. Any type of anode structure can be used in connection with the source cathode 280, such as a Schottky contact, a junction barrier diode device, a device including pGaN, and/or so forth. This implementation with the source cathode 280 can be combined with any of the structures described above.

FIGS. 16A through 16C are diagrams that illustrate variations of the HEMT device 200 shown in FIGS. 7A through 7D. Elements that were described above (and variations thereof) are not described again in connection with FIGS. 16A through 16C. In this implementation, the conductive striped portions 210D are entirely disposed below the drain contact D. In other words, the conductive striped portions 210D have a length U3 that is less than or equal to a width W2 of the drain contact D. FIG. 16B illustrates the conductive striped portion 210D-3 cut along A1, and FIG. 16C illustrates the conductive striped portions 210D-3 and 210D-4 cut along A4. Ohmic contacts (between the drain contacts D and carrier generation layer 103) are disposed between the conductive striped portions 210D.

Although not shown, in some implementations, each of the conductive striped portions 210D can have multiple segments (also can be referred to as sections). For example, the conductive striped portion 210D-3 can have multiple separate segments along line A1. The conductive striped portions 210D-3 can each have a length less than half of the width W2 of the drain contact D.

FIG. 16D illustrates a variation (cut along line A4) of a portion of the HEMT device 200 shown in FIGS. 16A through 16C that includes metal layer portions 256 disposed on the conductive striped portions 210D. The metal layer portions 256 can be made of the same material as the field plate 250 described in other embodiments. Ohmic or Schottky contacts are defined between the metal layer portions 256 and the conductive striped portions 210D.

FIG. 16E illustrates a variation (cut along line A4) of a portion of the HEMT device 200 shown in FIGS. 16A through 16D that includes metal layer portions 256 disposed on the conductive striped portions 210D. In this implementation, conductive striped portions 210D are disposed on mesas of the carrier generation layer 103. Recesses are formed in the carrier generation layer 103 between the conductive striped portions 210D.

FIG. 16F illustrates yet another variation (cut along line A4) of a portion of the HEMT device 200 shown in FIGS. 16A through 16E that includes metal layer portions 256 disposed on the conductive striped portions 210D. In this implementation, portions of the dielectric layers 215 can be disposed on at least sidewall portions and/or top surfaces of the conductive striped portions 210D. The dielectric layers 215 can have a least a portion disposed at least on a portion of the mesas and/or top surfaces of the carrier generation layer 103. Even with the dielectric layers 215, Ohmic or Schottky contacts are defined between the metal layer portions 256 and the conductive striped portions 210D.

In one general aspect, a semiconductor device includes a channel layer, a carrier generation layer disposed on the channel layer, and a source contact disposed on the carrier generation layer. The semiconductor device includes a drain contact disposed on the carrier generation layer, a gate contact disposed between the source contact and the drain contact, and a trench conductive material in contact with the drain contact and having at least a portion disposed in the carrier generation layer and in the channel layer.

In some implementations, the trench conductive material is in contact with the carrier generation layer and extends between the drain contact and the channel layer. In some implementations, the trench conductive material terminates within the channel layer. In some implementations, the semiconductor device can include a back barrier layer disposed below the channel layer. The trench conductive material can extend between the drain contact and the back barrier layer, and the trench conductive material can terminate in the back barrier layer.

In some implementations, the semiconductor device can include a back barrier layer disposed below the channel layer. The trench conductive material can extend from the drain contact and terminating above the back barrier layer. In some implementations, the semiconductor device is a high-electron-mobility transistor (HEMT) device configured to define a 2-dimensional electron gas layer. The carrier generation layer can include an aluminum gallium nitride (AlGaN) material, and the channel layer can include a gallium nitride (GaN) material.

In some implementations, the drain contact can define an ohmic contact with the carrier generation layer, and the source contact can define an ohmic contact with the carrier generation layer. The semiconductor device can include a dielectric layer disposed on the carrier generation layer, and the gate contact can be recessed within the dielectric layer.

In some implementations, the trench conductive material has a width less than a width of the drain contact. In some implementations, the semiconductor device is a depletion mode device or an enhancement mode device. In some implementations, the at least the portion of the trench conductive material is disposed within a trench disposed in the carrier generation layer and in the channel layer, and the trench is aligned along a same direction that the drain contact is aligned.

The semiconductor device of claim 1, wherein the trench conductive material is a first trench conductive material. The semiconductor device can include a second trench conductive material in contact with the source contact and having at least a portion disposed in the carrier generation layer and in the channel layer.

In some implementations, the trench conductive material is a first trench conductive material disposed in a first trench. The semiconductor device can include a second trench conductive material in contact with the drain contact and can have at least a portion disposed in the carrier generation layer and in the channel layer. The at least the portion of the second trench conductive material can be disposed in a second trench separate from the first trench such that a mesa is disposed between the first trench and the second trench.

In another general aspect, a semiconductor device can include a channel layer, a carrier generation layer disposed on the channel layer, and a source contact disposed on the carrier generation layer. The semiconductor device can include a drain contact disposed on the carrier generation layer, a gate contact disposed between the source contact and the drain contact, and a plurality of conductive striped portions electrically coupled with the drain contact.

In some implementations, the semiconductor device a spacer disposed between the gate contact and the carrier generation layer. In some implementations, the semiconductor device can include a spacer disposed between the gate contact and the carrier generation layer and can have a thickness the same as a thickness of the plurality conductive striped portions. In some implementations, the semiconductor device a spacer disposed between the gate contact and the carrier generation layer. The spacer and the plurality of conductive striped portions can be made of the same material and during the same manufacturing process.

In some implementations, the plurality of conductive striped portions can be made of a pGaN material. In some implementations, a conductive striped portion from the plurality of conductive striped portions is separated from the drain contact and is in direct electrical connection through a metal layer.

In another general aspect, a semiconductor device can include a channel layer, a carrier generation layer disposed on the channel layer, and a source contact disposed on the carrier generation layer. The semiconductor device can include a drain contact disposed on the carrier generation layer, a gate contact disposed between the source contact and the drain contact, and a conductive striped portion electrically coupled with the drain contact. The semiconductor device can include a conductive transverse portion disposed between the conductive striped portion and the gate contact. The conductive transverse portion can be aligned non-parallel to the conductive striped portion. In some implementations, the semiconductor device can include a field plate coupled to the conductive transverse portion.

The following description supplies specific details in order to provide a thorough understanding. Nevertheless, the skilled artisan would understand that the semiconductor devices and associated methods of making and using the devices can be implemented and used without employing these specific details. Indeed, the semiconductor devices and associated methods can be placed into practice by modifying the illustrated devices and methods and can be used in conjunction with any other apparatus and techniques conventionally used in the industry. For example, while description refers to HEMT devices, it could be modified for other types of semiconductor devices. As well, although the devices are described with reference to a particular type of conductivity (P or N), the devices can be configured with a combination of the same type of dopant or can be configured with the opposite type of conductivity (N or P, respectively) by appropriate modifications.

It is understood that all material types provided herein are for illustrative purposes only. Accordingly, one or more of the various dielectric layers in the embodiments described herein may comprise low-k or high-k dielectric materials. As well, while specific dopants are names for the n-type and p-type dopants, any other known n-type and p-type dopants (or combination of such dopants) can be used in the semiconductor devices. As well, although the devices of the invention are described with reference to a particular type of conductivity (P or N), the devices can be configured with a combination of the same type of dopant or can be configured with the opposite type of conductivity (N or P, respectively) by appropriate modifications.

In addition to any previously indicated modification, numerous other variations and alternative arrangements may be devised by those skilled in the art without departing from the spirit and scope of this description, and appended claims are intended to cover such modifications and arrangements. Thus, while the information has been described above with particularity and detail in connection with what is presently deemed to be the most practical and preferred aspects, it will be apparent to those of ordinary skill in the art that numerous modifications, including, but not limited to, form, function, manner of operation and use may be made without departing from the principles and concepts set forth herein. Also, as used herein, examples are meant to be illustrative only and should not be construed to be limiting in any manner.

What is claimed is:

1. A semiconductor device, comprising:
   a channel layer;
   a carrier generation layer disposed on the channel layer;
   a source contact disposed on the carrier generation layer;
   a drain contact disposed on the carrier generation layer;

a gate contact disposed between the source contact and the drain contact;

a plurality of conductive stripes disposed on the carrier generation layer in direct contact with the carrier generation layer and electrically coupled with the drain contact; and a spacer disposed between the gate contact and the carrier generation layer, the spacer having a same thickness as a thickness of the plurality of conductive stripes.

2. The semiconductor device of claim 1, wherein the spacer and the plurality of conductive stripes are made of a same material and during a same manufacturing process.

3. The semiconductor device of claim 1, wherein the plurality of conductive stripes are made of a pGaN material.

4. The semiconductor device of claim 1, wherein a portion of a conductive stripe from the plurality of conductive stripes is physically separated from the drain contact and in direct electrical connection with the drain contact through an intervening metal layer.

5. A semiconductor device, comprising:
a channel layer;
a carrier generation layer disposed on the channel layer;
a source contact disposed on the carrier generation layer;
a drain contact disposed on the carrier generation layer;
a gate contact disposed between the source contact and the drain contact;
a conductive stripe disposed directly on the carrier generation layer and electrically coupled with the drain contact; and
a conductive transverse stripe disposed directly on the carrier generation layer between the conductive stripe and the gate contact, the conductive transverse stripe being aligned non-parallel to the conductive stripe and not in direct physical contact with the conductive stripe.

6. The semiconductor device of claim 5, further comprising:
a field plate coupled to the conductive transverse stripe.

7. A semiconductor device, comprising:
a channel layer;
a carrier generation layer disposed on the channel layer;
a source contact disposed on the carrier generation layer;
a drain contact disposed on the carrier generation layer;
a gate contact disposed between the source contact and the drain contact; and
a plurality of conductive stripes disposed on the carrier generation layer in direct contact with the carrier generation layer and electrically coupled with the drain contact, wherein a portion of a conductive stripe from the plurality of conductive stripes is physically separated from the drain contact and is in direct electrical connection through an intervening metal layer.

8. The semiconductor device of claim 7, further comprising:
a spacer disposed between the gate contact and the carrier generation layer.

9. The semiconductor device of claim 8, wherein the spacer has a same thickness as a thickness of the plurality of conductive stripes.

10. The semiconductor device of claim 8, wherein the spacer and the plurality of conductive stripes are made of a same material and during a same manufacturing process.

11. The semiconductor device of claim 8, wherein the plurality of conductive stripes are made of a pGaN material.

12. A semiconductor device, comprising:
a channel layer;
a carrier generation layer disposed on the channel layer;
a source contact disposed on the carrier generation layer;
a drain contact disposed on the carrier generation layer;
a gate contact disposed between the source contact and the drain contact;
a plurality of conductive stripes disposed on the carrier generation layer in direct contact with the carrier generation layer and electrically coupled with the drain contact; and a spacer
disposed between the gate contact and the carrier generation layer,
wherein the spacer and the plurality of conductive stripes are made of a same material.

13. The semiconductor device of claim 12, wherein the spacer has a same thickness as a thickness of the plurality of conductive stripes.

14. The semiconductor device of claim 12, wherein the plurality of conductive stripes are made of a pGaN material.

15. The semiconductor device of claim 12, wherein a portion of a conductive stripe from the plurality of conductive stripes is physically separated from the drain contact and in a direct electrical connection with the drain contact through an intervening metal layer.

16. The semiconductor device of claim 15, further comprising:
a conductive transverse stripe disposed directly on the carrier generation layer between the portion of the conductive stripe and the gate contact, the conductive transverse stripe being aligned non-parallel to the portion of the conductive stripe and not in direct physical contact with the conductive stripe.

* * * * *